United States Patent
Kondo et al.

(10) Patent No.: US 11,929,589 B2
(45) Date of Patent: Mar. 12, 2024

(54) LIGHT-EMITTING COMPONENT

(71) Applicant: FUJIFILM Business Innovation Corp., Tokyo (JP)

(72) Inventors: Takashi Kondo, Kanagawa (JP);
Michiaki Murata, Kanagawa (JP);
Kenichi Ono, Kanagawa (JP);
Masahiro Yoshikawa, Kanagawa (JP);
Takehito Hikichi, Kanagawa (JP); Yuji Shirai, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 412 days.

(21) Appl. No.: 17/128,175

(22) Filed: Dec. 20, 2020

(65) Prior Publication Data
US 2021/0305771 A1   Sep. 30, 2021

(30) Foreign Application Priority Data

Mar. 24, 2020 (JP) .................. 2020-053262

(51) Int. Cl.
*H01S 5/183* (2006.01)
*H01L 27/08* (2006.01)
(Continued)

(52) U.S. Cl.
CPC .......... *H01S 5/042* (2013.01); *H01L 27/0817* (2013.01); *H01S 5/0239* (2021.01);
(Continued)

(58) Field of Classification Search
CPC .... H01S 5/042; H01S 5/18313; H01S 5/3095; H01S 5/423; H01L 27/0817
See application file for complete search history.

(56) References Cited

U.S. PATENT DOCUMENTS

| 7,948,004 B2 | 5/2011 | Suzuki |
| 2013/0188659 A1 | 7/2013 | Kondo et al. |

(Continued)

FOREIGN PATENT DOCUMENTS

| JP | H01238962 | 9/1989 |
| JP | 2001308385 | 11/2001 |

(Continued)

OTHER PUBLICATIONS

"Notice of Reasons for Refusal of Japan Counterpart Application No. 2020-053262", dated Jan. 9, 2024, with English translation thereof, p. 1-p. 7.

*Primary Examiner* — Yuanda Zhang
(74) *Attorney, Agent, or Firm* — JCIPRNET

(57) ABSTRACT

A light-emitting component includes: a substrate; plural light-emitting elements that are disposed on the substrate and that emit light in a direction intersecting with a surface of the substrate; and plural thyristors that are stacked on the plural light-emitting elements and that are turned ON to drive the corresponding light-emitting elements so that the light-emitting elements emit light or an amount of light emitted from the light-emitting elements is increased. Each of the plural light-emitting elements includes a current confinement region which is oxidized via a hole provided in a multilayer structure. The multilayer structure is constituted by a corresponding light-emitting element and a corresponding thyristor.

12 Claims, 10 Drawing Sheets

(51) Int. Cl.
    *H01S 5/0239* (2021.01)
    *H01S 5/026* (2006.01)
    *H01S 5/042* (2006.01)
    *H01S 5/30* (2006.01)
    *H01S 5/42* (2006.01)

(52) U.S. Cl.
    CPC ........ *H01S 5/0261* (2013.01); *H01S 5/18313* (2013.01); *H01S 5/3095* (2013.01); *H01S 5/423* (2013.01)

(56) References Cited

U.S. PATENT DOCUMENTS

| | | | |
|---|---|---|---|
| 2018/0234584 A1* | 8/2018 | Kondo | ............... H01L 33/30 |
| 2018/0309890 A1 | 10/2018 | Kondo | |
| 2019/0052061 A1* | 2/2019 | Kondo | ............... H01S 5/42 |
| 2019/0086831 A1* | 3/2019 | Kondo | ............ G03G 15/04054 |
| 2020/0203927 A1* | 6/2020 | Lee | ............... H01S 5/2063 |

FOREIGN PATENT DOCUMENTS

| | | |
|---|---|---|
| JP | 2009286048 | 12/2009 |
| JP | 2013175712 | 9/2013 |
| JP | 2017183436 | 10/2017 |
| JP | 2019057652 | 4/2019 |

\* cited by examiner

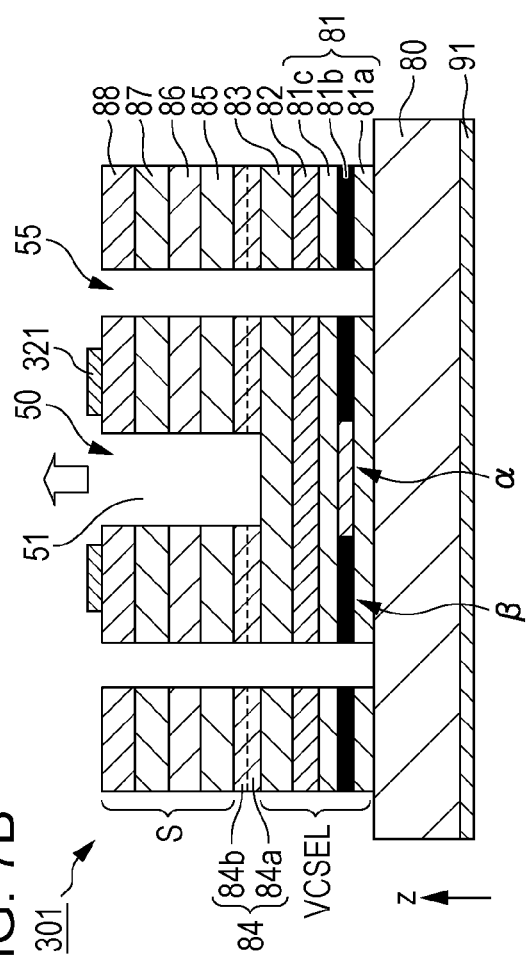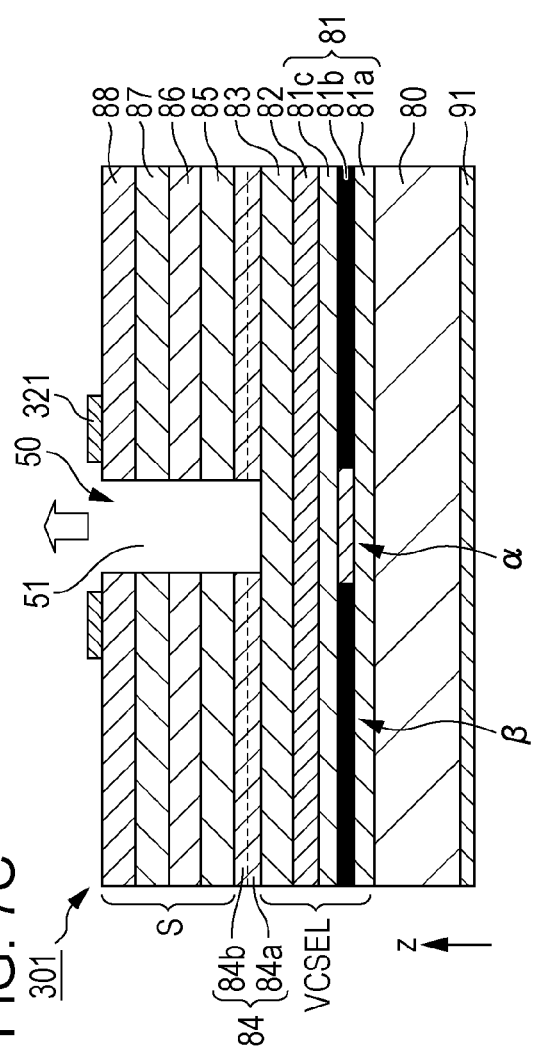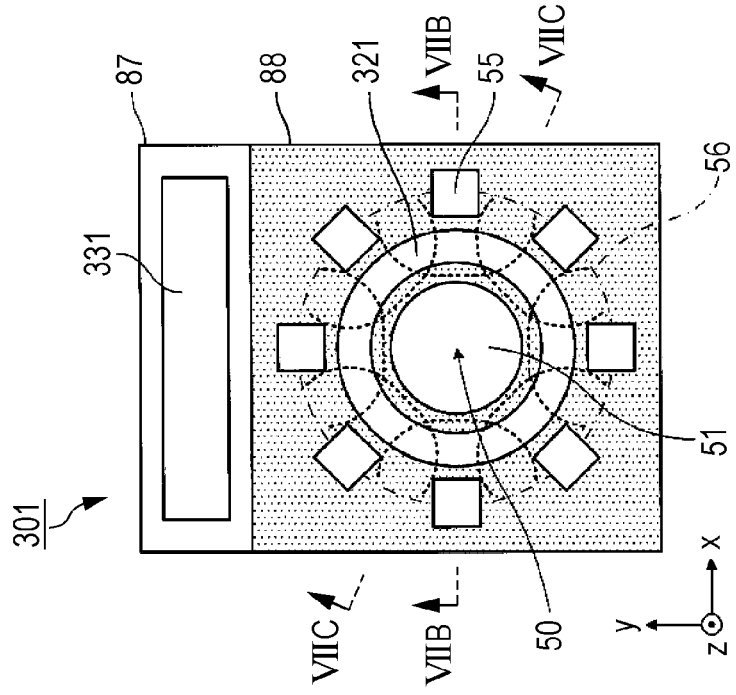

LIGHT-EMITTING COMPONENT

CROSS-REFERENCE TO RELATED APPLICATIONS

This application is based on and claims priority under 35 USC 119 from Japanese Patent Application No. 2020-053262 filed Mar. 24, 2020.

BACKGROUND

(i) Technical Field

The present disclosure relates to a light-emitting component.

(ii) Related Art

Japanese Unexamined Patent Application Publication No. 01-238962 discloses the following light-emitting element array. Multiple light-emitting elements whose threshold voltages or threshold currents can be controlled from an external source are arranged linearly, two-dimensionally, or three-dimensionally. Electrodes for controlling the threshold voltages or the threshold currents of the individual light-emitting elements are electrically connected with each other. Clock lines are connected to the corresponding light-emitting elements so as to apply a voltage or a current from an external source to the light-emitting elements.

Japanese Unexamined Patent Application Publication No. 2009-286048 discloses the following self-scanning light source head. The self-scanning light source head includes a substrate, surface-emitting semiconductor lasers, and thyristors. The surface-emitting semiconductor lasers are disposed on the substrate in an array. The thyristors are disposed on the substrate and serve as switching elements for selectively turning ON or OFF the light emission of the surface-emitting semiconductor lasers.

Japanese Unexamined Patent Application Publication No. 2001-308385 discloses the following self-scanning light-emitting device. Light-emitting elements are constituted by six pnpnpn layers formed as a semiconductor structure. Electrodes are disposed on the first p-type layer and the sixth n-type layer at the ends of the semiconductor structure and on the third p-type layer and the fourth n-type layer at the central portion of the semiconductor structure. The fifth and sixth pn layers serve as light-emitting diodes, while the first through fourth pnpn layers serve as thyristors.

SUMMARY

In a self-scanning light-emitting element array including a light-emitting portion and a drive portion, if light-emitting elements and thyristors used for driving the light-emitting elements are formed of the same semiconductor multilayer films, it is difficult to set the light-emitting characteristics of the light-emitting elements and the driving characteristics of the thyristors separately. To address this issue, a multilayer structure constituted by a thyristor and a light-emitting element stacked on each other via a tunnel junction layer may be formed so as to separately set the characteristics of the light-emitting element and those of the thyristor. In such a multilayer structure, a current confinement region is provided in the light-emitting element. This current confinement region is oxidized only from the outer edges of the multilayer structure, which makes the sectional area of the multilayer structure smaller. This increases the resistance of a path through which a current flows from the thyristor to the light-emitting element.

Aspects of non-limiting embodiments of the present disclosure relate to providing a light-emitting component that makes it possible to reduce the resistance of a path through which a current flows from a thyristor to a light-emitting element, unlike the configuration in which a current confinement region is oxidized only from the outer edges of a multilayer structure.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a light-emitting component including: a substrate; plural light-emitting elements that are disposed on the substrate and that emit light in a direction intersecting with a surface of the substrate; and plural thyristors that are stacked on the plural light-emitting elements and that are turned ON to drive the corresponding light-emitting elements so that the light-emitting elements emit light or an amount of light emitted from the light-emitting elements is increased. Each of the plural light-emitting elements includes a current confinement region which is oxidized via a hole provided in a multilayer structure. The multilayer structure is constituted by a corresponding light-emitting element and a corresponding thyristor.

BRIEF DESCRIPTION OF THE DRAWINGS

An exemplary embodiment of the present disclosure will be described in detail based on the following figures, wherein:

FIG. 7A is an enlarged plan view of a multilayer structure constituted by a vertical cavity surface emitting laser (VCSEL) and a setting thyristor stacked on each other in the light-emitting chip of the exemplary embodiment;

FIG. 7B is a sectional view taken along line VIIB-VIIB in FIG. 7A;

FIG. 7C is a sectional view taken along line VIIC-VIIC in FIG. 7A;

DETAILED DESCRIPTION

An exemplary embodiment of the disclosure will be described below in detail with reference to the accompanying drawings. Hereinafter, chemical elements will simply be represented by element symbols. For example, aluminum is designated by Al.

The exemplary embodiment will be discussed, assuming that light-emitting chips C, each of which is an example of a light-emitting component, are applied to an image forming apparatus 1.

(Image Forming Apparatus 1)

Figure 1:
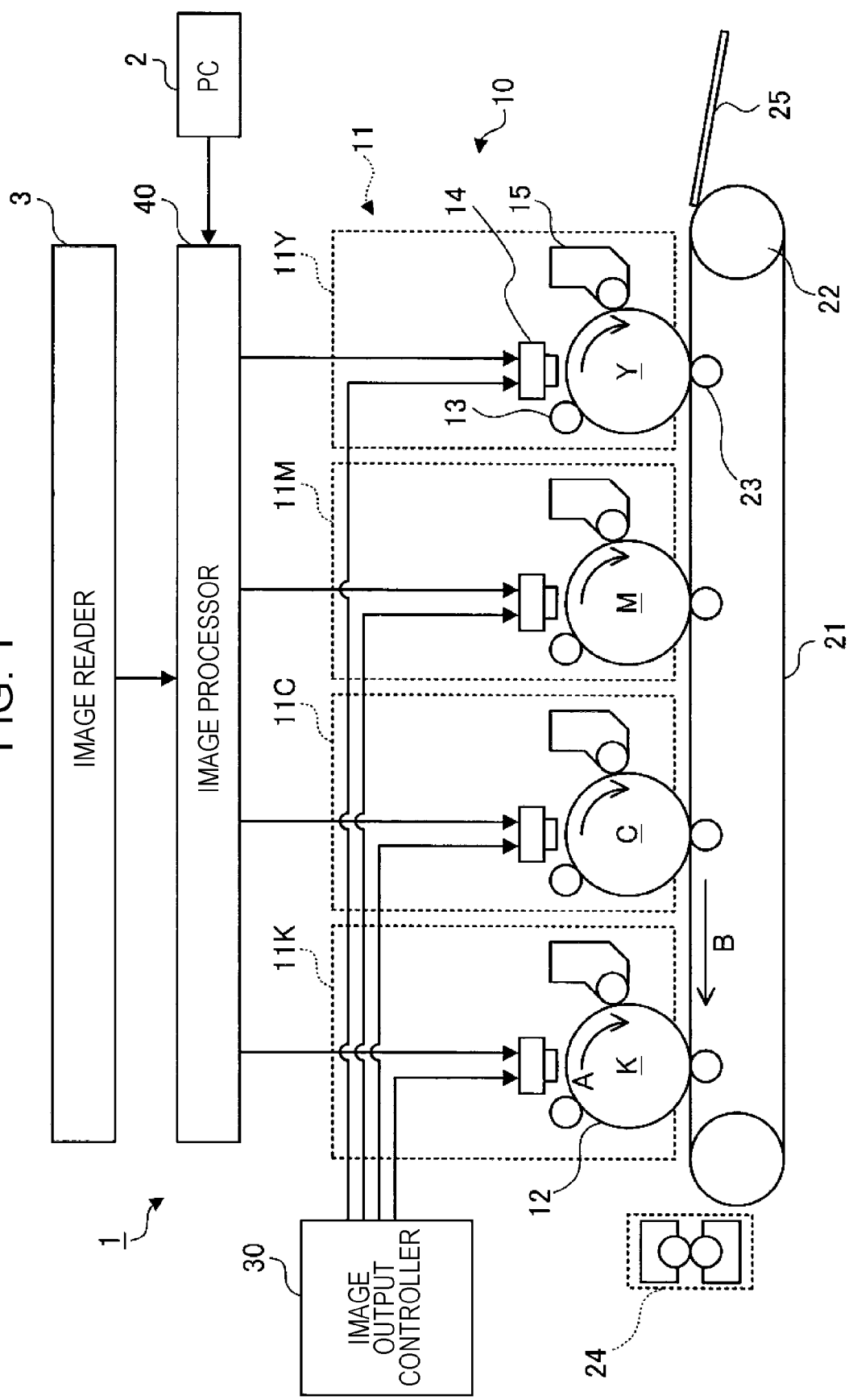
FIG. 1 illustrates an example of the overall configuration of an image forming apparatus.

FIG. 1 illustrates an example of the overall configuration of the image forming apparatus 1. The image forming apparatus 1, which is typically a tandem image forming apparatus, includes an image forming processor 10, an image output controller 30, and an image processor 40. The image forming processor 10 forms images based on image data of individual colors. The image output controller 30 controls the image forming processor 10. The image processor 40 is connected to a personal computer (PC) 2 and an image reader 3, for example, and executes predetermined image processing on image data received from the PC 2 and the image reader 3.

The image forming processor 10 includes image forming units 11Y, 11M, 11C, and 11K (simply called the image forming units 11 unless it is necessary to distinguish them from each other) disposed in parallel with each other at predetermined spacings. The image forming units 11 each include a photoconductor drum 12, a charger 13, a print head 14, and a developing device 15. The photoconductor drum 12 is an example of an image carrier that holds a toner image thereon formed from an electrostatic latent image. The charger 13 is an example of a charging unit that charges the surface of the photoconductor drum 12 at a predetermined potential. The print head 14 exposes the photoconductor drum 12 charged by the charger 13 to light. The developing device 15 develops the electrostatic latent image formed on the photoconductor drum 12 by the print head 14. The image forming units 11Y, 11M, 11C, and 11Y form a yellow (Y) toner image, a magenta (M) toner image, a cyan (C) toner image, and a black (K) toner image, respectively.

The image forming processor 10 includes a sheet transport belt 21, drive rollers 22, transfer rollers 23, and a fixing unit 24. The sheet transport belt 21 transports a recording sheet 25, which is an example of a transfer subject, such as paper, so that toner images of the individual colors formed on the photoconductor drums 12 of the image forming units 11Y, 11M, 11C, and 11K can be transferred to the recording sheet 25 in a superimposed manner. The drive rollers 22 drive the sheet transfer belt 21. The transfer rollers 23 are an example of a transfer unit that transfers the toner images on the photoconductor drums 12 onto the recording sheet 25. The fixing unit 24 fixes the toner images on the recording sheet 25.

In the image forming apparatus 1, the image forming processor 10 performs an image forming operation based on various control signals supplied from the image output controller 30. Under the control of the image output controller 30, image data received from the PC 2 and the image reader 3 is subjected to image processing by the image processor 40 and is supplied to the image forming units 11. In the image forming unit 11K, for example, while rotating in the direction indicated by the arrow A in FIG. 1, the photoconductor drum 12 is charged at a predetermined potential by the charger 13 and is exposed to light by the print head 14. The print head 14 emits light based on the image data supplied from the image processor 40. As a result, an electrostatic latent image corresponding to a black (K) image is formed on the photoconductor drum 12. The electrostatic latent image formed on the photoconductor drum 12 is then developed by the developing device 15, so that a black (K) toner image is formed on the photoconductor drum 12. Likewise, a yellow (Y) toner image, a magenta (M) toner image, and a cyan (C) toner image are formed in the image forming units 11Y, 11M, and 11C, respectively.

By the application of transfer electric fields to the transfer rollers 23, the toner images of the individual colors formed on the photoconductor drums 12 of the image forming units 11 are sequentially transferred to the recording sheet 25, which is supplied in accordance with the movement of the sheet transfer belt 21 rotated in the direction indicated by the arrow B in FIG. 1. As a result, on the recording sheet 25, a synthesized toner image generated by superimposing the toner images of the individual colors on each other is formed.

The recording sheet 25 having the synthesized toner image thereon is transported to the fixing unit 24. The synthesized toner image on the recording sheet 25 is fixed on the recording sheet 25 after being subjected to fixing processing using heat and pressure in the fixing unit 24. The recording sheet 25 is then output from the image forming apparatus 1.

(Print Head 14)

Figure 2:
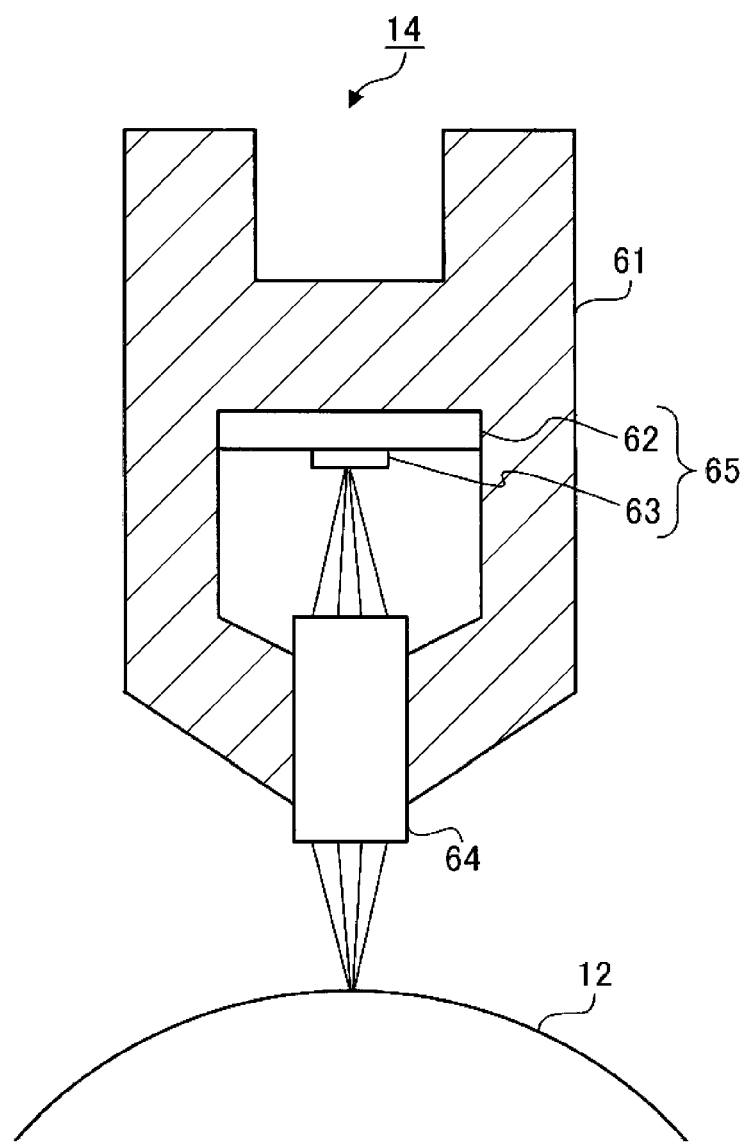
FIG. 2 is a sectional view illustrating an example of the configuration of a print head.

FIG. 2 is a sectional view illustrating an example of the configuration of the print head 14. The print head 14, which is an example of an exposure unit, includes a housing 61, a light-emitting device 65, and a rod lens array 64. The light-emitting device 65, which is an example of a light-emitting unit, includes a light source 63 having multiple light-emitting elements which expose the photoconductor drum 12 to light. The rod lens array 64 is an example of an optical unit that causes light emitted from the light source 63 to form an image on the surface of the photoconductor drum 12. In the exemplary embodiment, the light-emitting elements are vertical cavity surface emitting lasers (VCSELs). Hereinafter, the light-emitting elements may also be called VCSELs. In a VCSEL, light resonates to generate laser oscillation in a light-emitting layer sandwiched between two distributed Bragg reflector (DBR) layers. When the reflectivity of the light-emitting layer with respect to the two DBR layers reaches 99% or higher, for example, laser oscillation occurs.

The light-emitting device 65 includes a circuit substrate 62 on which the above-described light source 63 and a signal generating circuit 110 (see FIG. 3) for driving the light source 63 are mounted.

The housing 61 is formed of a metal, for example, and supports the circuit substrate 62 and the rod lens array 64 such that the surface of the light source 63 from which light from the light-emitting elements is output serves as the focal plane of the rod lens array 64. The rod lens array 64 is disposed in the axis direction (which is the main scanning direction and is also the X direction in FIGS. 3 and 4B) of the photoconductor drum 12.

(Light-Emitting Device 65)

Figure 3:
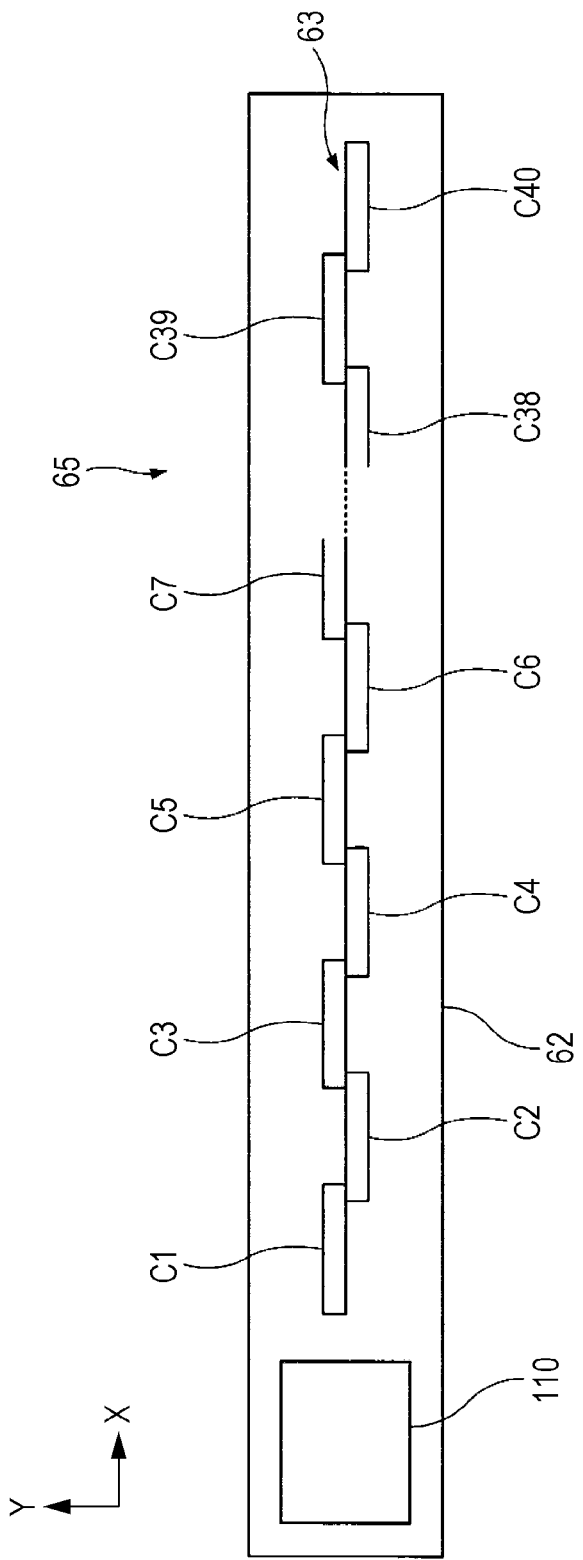
FIG. 3 is a top view illustrating an example of a light-emitting device.

FIG. 3 is a top view illustrating an example of the light-emitting device 65.

In the light-emitting device 65 shown in FIG. 3, the light source 63 is constituted by light-emitting chips C1 through C40 (which will be collectively called the light-emitting chips C unless it is necessary to distinguish them from each other) disposed on the circuit substrate 62. More specifically, the light-emitting chips C are disposed in two rows in a staggered arrangement in the X direction, which is the main scanning direction. The light-emitting chips C1 through C40 are an example of forty light-emitting components and are configured in the same manner.

In the specification, the light-emitting chips C1 through C40 are arranged in numerical order.

Although in the exemplary embodiment the forty light-emitting chips C are used, the number of light-emitting chips C is not limited to forty.

The light-emitting device 65 includes a signal generating circuit 110 mounted thereon, which drives the light source 63. The signal generating circuit 110 is constituted by an integrated circuit (IC), for example. The signal generating circuit 110 may not necessarily be mounted on the light-emitting device 65. Instead, the signal generating circuit 110 may be provided outside the light-emitting device 65 and supply a control signal for controlling the light-emitting chips C via a cable, for example. A description will be given below, assuming that the light-emitting device 65 includes the signal generating circuit 110.

Details of the arrangement of the light-emitting chips C will be discussed later.

Figure 4:
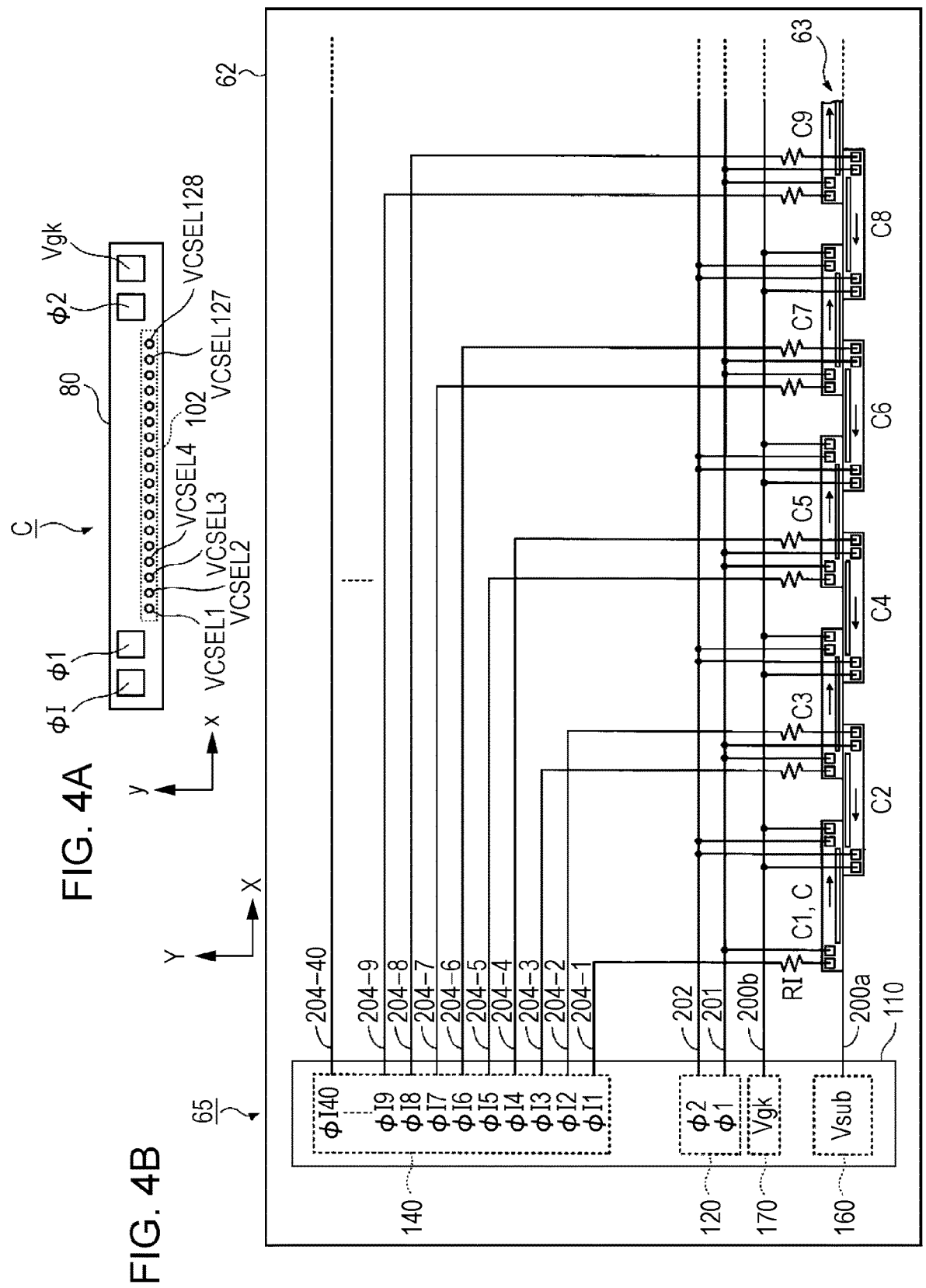
FIG. 4A illustrates an example of the configuration of a light-emitting chip.
FIG. 4B illustrates an example of the configuration of a signal generating circuit of the light-emitting device and also an example of the wiring (lines) on a circuit substrate.

FIG. 4A illustrates an example of the configuration of the light-emitting chip C. FIG. 4B illustrates an example of the configuration of the signal generating circuit 110 of the light-emitting device 65 and also an example of the wiring (lines) on the circuit substrate 62. In FIG. 4B, among the light-emitting chips C1 through C40, the light-emitting chips C1 through C9 are only shown.

The configuration of the light-emitting chip C shown in FIG. 4A will first be explained.

The light-emitting chip C includes a light-emitting portion 102. The light-emitting portion 102 includes VCSELs (VCSEL1 through VCSEL128) disposed in a row near a long side on the front surface of a substrate 80 formed in a rectangular shape. The light-emitting chip C also includes plural terminals ($\phi$1 terminal, $\phi$2 terminal, Vgk terminal, and $\phi$I terminal) at both sides of the substrate 80 in the longitudinal direction on the front surface of the substrate 80. The terminals are bonding pads for receiving various control signals, for example. The terminals are arranged in order of $\phi$I terminal and $\phi$1 terminal from one side of the substrate 80 and in order of Vgk terminal and $\phi$2 terminal from the other side of the substrate 80. The light-emitting portion 102 is disposed between the $\phi$1 terminal and the $\phi$2 terminal. On the back surface of the substrate 80, a back-surface electrode 91 (see FIG. 6B), which serves as a Vsub terminal, is disposed. On the front surface of the substrate 80, the arrangement direction of the VCSEL1 through VCSEL128 is set to be the x direction, while the direction perpendicular to the x direction is set to be the y direction.

"Being disposed in a row" is not restricted to the state in which the VCSELs are aligned as shown in FIG. 4A, and may be the state in which the VCSELs are displaced from each other in the direction perpendicular to the row direction. For example, the individual VCSELs may be disposed by an amount of displacement in the direction perpendicular to the row direction. Alternatively, the VCSELs may be disposed in a zigzag manner at every other VCSELs or at a group of multiple VCSELs.

The configuration of the signal generating circuit 110 and that of the wiring (lines) on the circuit substrate 62 of the light-emitting device 65 will now be discussed below with reference to FIG. 4B.

As stated above, on the circuit substrate 62 of the light-emitting device 65, the signal generating circuit 110 and the light-emitting chips C1 through C40 are mounted, and the wiring (lines) for connecting the signal generating circuit 110 and the light-emitting chips C1 through C40 is arranged.

The configuration of the signal generating circuit 110 will first be explained.

Items of image data subjected to image processing by the image processor 40 (see FIG. 1) and various control signals from the image output controller 30 (see FIG. 1) are input into the signal generating circuit 110. The signal generating circuit 110 rearranges the items of image data and adjusts the amount of light in accordance with the received items of image data and various control signals.

The signal generating circuit 110 includes a transfer signal generator 120 that sends a first transfer signal $\phi$1 and a second transfer signal $\phi$2 to the light-emitting chips C1 through C40, based on the various control signals.

The signal generating circuit 110 also includes an ON-signal generator 140 that sends ON signals $\phi$I1 through $\phi$I40 (simply called ON signals $\phi$I unless it is necessary to distinguish them from each other) to the light-emitting chips C1 through C40, respectively, based on the various control signals.

The signal generating circuit 110 also includes a reference potential supplier 160 and a power supply potential supplier 170. The reference potential supplier 160 supplies a reference potential Vsub, which serves as a reference of the potential, to the light-emitting chips C1 through C40. The power supply potential supplier 170 supplies a power supply potential Vgk to the light-emitting chips C1 through C40 to drive them.

The arrangement of the light-emitting chips C1 through C40 will be discussed below.

The odd-numbered light-emitting chips C1, C3, C5, . . . are disposed in a row at certain intervals in the direction along the long sides of the corresponding substrates 80. The even-numbered light-emitting chips C2, C4, C6, . . . are also disposed in a row at certain intervals in the direction along the long sides of the corresponding substrates 80. The odd-numbered light-emitting chips C1, C3, C5, . . . and the even-numbered light-emitting chips C2, C4, C6, . . . are disposed in a staggered arrangement. More specifically, the even-numbered light-emitting chips C2, C4, C6, . . . are located at positions at which the odd-numbered light-emitting chips C1, C3, C5, . . . are rotated by 180° and vice versa so that the long sides of the light-emitting portion 102 of the odd-numbered light-emitting chips C and those of the even-numbered light-emitting chips C oppose each other. In each of the light-emitting chips C, the VCSELs are arranged at predetermined intervals in the main scanning direction (X direction). In each of the light-emitting chips C1 through C40 shown in FIG. 4B, the arrangement direction of the VCSELs (the numerical order of VCSEL1 through VCSEL128) forming the light-emitting portion 102 shown in FIG. 4A is indicated by the arrow in FIG. 4B.

The wiring (lines) for connecting the signal generating circuit 110 and the light-emitting chips C1 through C40 will be described below.

A power supply line 200a is laid on the circuit substrate 62. The power supply line 200a is connected to the back-surface electrode 91 (see FIG. 6B), which serves as the Vsub terminal, provided on the back surface of the substrate 80 of the light-emitting chip C, and is used for supplying the reference potential Vsub from the reference potential supplier 160 to the back-surface electrode 91.

A power supply line 200b is also laid on the circuit substrate 62. The power supply line 200b is connected to the Vgk terminal provided on the light-emitting chip C, and is used for supplying the power supply potential Vgk from the power supply potential supplier 170 to the light-emitting chip C to drive it.

A first transfer signal line 201 and a second transfer signal line 202 are also laid on the circuit substrate 62. The first transfer signal line 201 is used for supplying the first transfer signal $\phi 1$ from the transfer signal generator 120 to the $\phi 1$ terminal of each of the light-emitting chips C1 through C40. The second transfer signal line 202 is used for supplying the second transfer signal $\phi 2$ from the transfer signal generator 120 to the $\phi 2$ terminal of each of the light-emitting chips C1 through C40. The first and second transfer signals $\phi 1$ and $\phi 2$ are sent in parallel to all the light-emitting chips C1 through C40.

ON signal lines 204-1 through 204-40 (simply called the ON signal lines 204 unless it is necessary to distinguish them from each other) are also laid on the circuit substrate 62. The ON signal lines 204-1 through 204-40 respectively supply the ON signals $\phi I1$ through $\phi I40$ from the ON-signal generator 140 to the $\phi I$ terminals of the light-emitting chips C1 through C40 via respective current limiting resistors RI.

As discussed above, the reference potential Vsub and the power supply potential Vgk are supplied to all the light-emitting chips C1 through C40 on the circuit substrate 62. The first and second transfer signals $\phi 1$ and $\phi 2$ are also sent in parallel to all the light-emitting chips C1 through C40. In contrast, the ON signals $\phi I1$ through $\phi I40$ are individually sent to the light-emitting chips C1 through C40, respectively.

(Light-Emitting Chip C)

Figure 5:
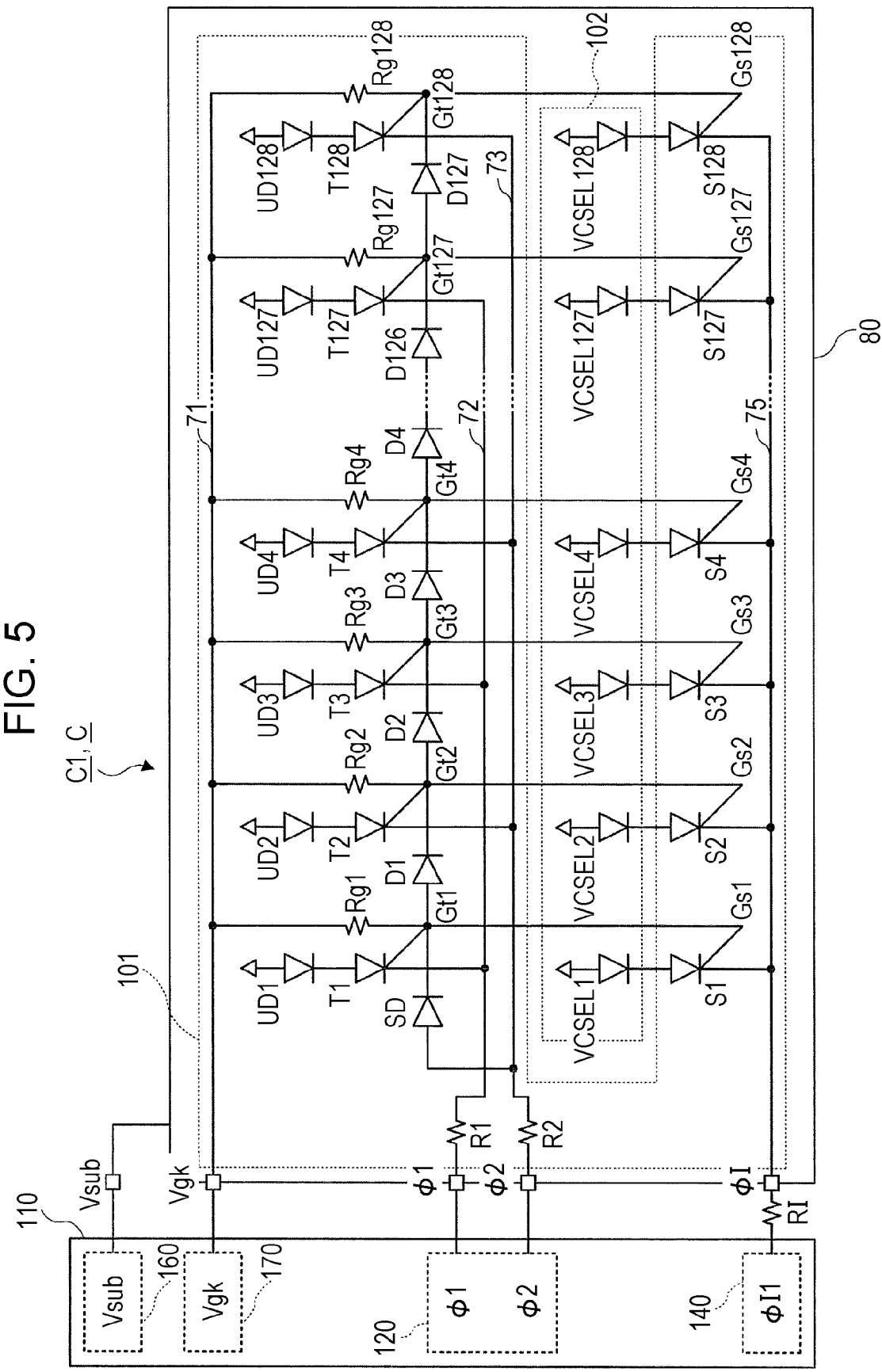
FIG. 5 is an equivalent circuit diagram illustrating the circuit configuration of the light-emitting chip.

FIG. 5 is an equivalent circuit diagram illustrating the circuit configuration of the light-emitting chip C. Elements described below are arranged based on the layout on the light-emitting chip C shown in FIGS. 6A and 6B, except for the terminals ($\phi 1$ terminal, $\phi 2$ terminal, Vgk terminal, and $\phi I$ terminal). The terminals ($\phi 1$ terminal, $\phi 2$ terminal, Vgk terminal, and $\phi I$ terminal) are shown in the order indicated as that at the left side of FIG. 5 for the sake of an explanation of the connection relationship with the signal generating circuit 110, though the positions thereof are different from those in FIG. 4A. The Vsub terminal provided on the back surface of the substrate 80 is shown outside the substrate 80.

The light-emitting chip C will be explained through illustration of the light-emitting chip C1 by way of example while referring to the relationship with the signal generating circuit 110. In FIG. 5, the light-emitting chip C is designated by C1(C). The other light-emitting chips C2 through C40 are configured in the same manner as the light-emitting chip C1.

The light-emitting chip C1(C) includes the light-emitting portion 102 (see FIG. 4A) constituted by the VCSEL1 through VCSEL128.

The light-emitting chip C1(C) also includes setting thyristors S1 through S128 (simply called the setting thyristors S unless it is necessary to distinguish them from each other).

The VCSEL1 through VCSEL128 are connected in series with the setting thyristors S1 through S128, respectively.

Figure 6B:
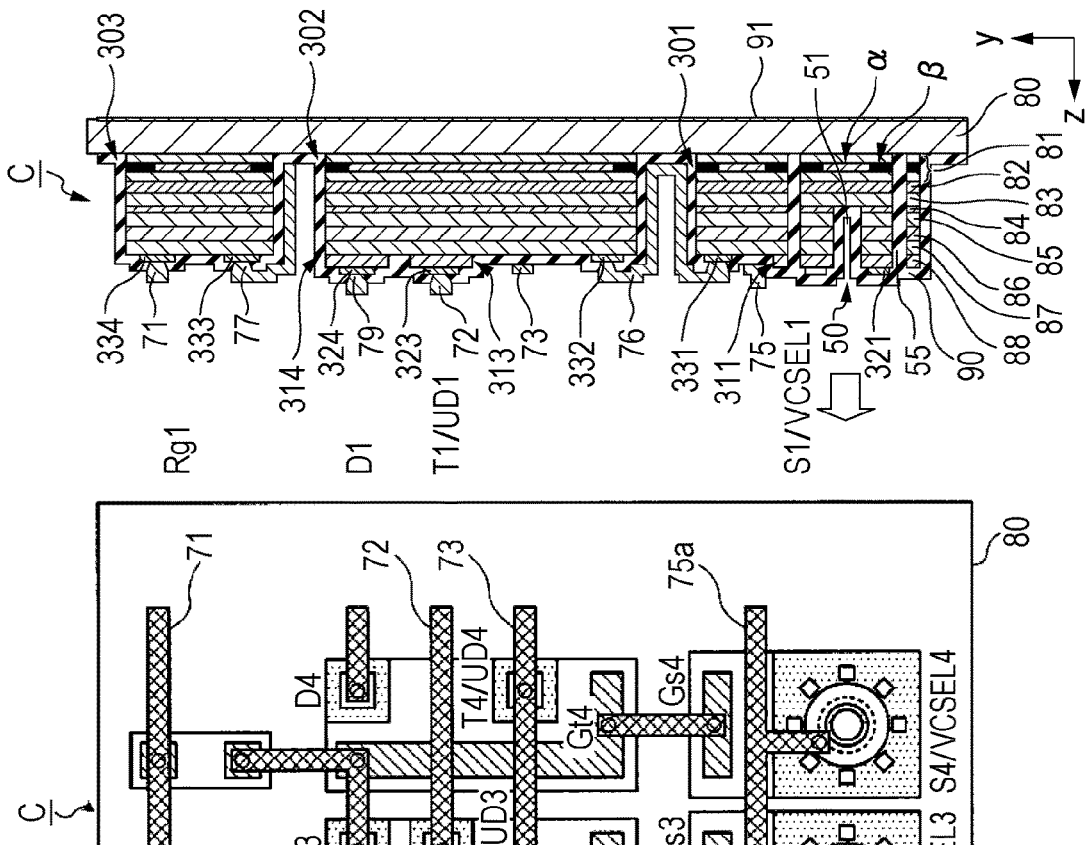
FIG. 6B is a sectional view taken along line VIB-VIB in FIG. 6A.

As shown in FIG. 6B, the setting thyristors S are disposed on top of the VCSELs arranged in a row on the substrate 80. Accordingly, the setting thyristors S1 through S128 are also arranged in a row. The setting thyristors S are used for setting (controlling) the ON/OFF states of the VCSELs, which will be described later, and are thus elements for driving the VCSELs. The setting thyristors S may simply be called the thyristors.

The light-emitting chip C1(C) also includes transfer thyristors T1 through T128 (simply called the transfer thyristors T unless it is necessary to distinguish them from each other). The transfer thyristors T are also arranged in a row, as in the setting thyristors S1 through S128.

The light-emitting chip C1(C) also includes under diodes UD1 through UD128 (simply called the under diodes UD unless it is necessary to distinguish them from each other). The structure (diode structure) of the under diodes UD is similar to that of the VCSELs. The under diodes UD1 through UD128 are connected in series with the transfer thyristors T1 through T128, respectively.

As shown in FIG. 6B, the transfer thyristors T arranged in a row are disposed on top of the under diodes UD on the substrate 80. Accordingly, the under diodes UD1 through UD128 are also arranged in a row.

The transfer thyristors T are used as an example of transfer elements. However, another type of circuit elements may be used if they are sequentially turned ON. For example, a shift register or circuit elements formed by a combination of multiple transistors may be used.

The light-emitting chip C1(C) also includes coupling diodes D1 through D127 (simply called the coupling diodes D unless it is necessary to distinguish them from each other). The coupling diodes D1 through D127 are arranged in the following manner. The transfer thyristors T1 through T128 are divided into pairs in numerical order and the coupling diodes D1 through D127 are each disposed between the transfer thyristors T of the corresponding pair.

The light-emitting chip C1(C) also includes power supply line resistors Rg1 through Rg128 (simply called the power supply line resistors Rg unless it is necessary to distinguish them from each other).

The light-emitting chip C1(C) also includes a start diode SD and current limiting resistors R1 and R2. The current limiting resistor R1 prevents an excessive current from flowing through a first transfer signal line 72 through which the first transfer signal $\phi 1$ is sent, while the current limiting resistor R2 prevents an excessive current from flowing through a second transfer signal line 73 through which the second transfer signal $\phi 2$ is sent.

The setting thyristors S1 through S128, transfer thyristors T1 through T128, under diodes UD1 through UD128, power supply line resistors Rg1 through Rg128, coupling diodes D1 through D127, start diode SD, and current limiting resistors R1 and R2 form a drive portion 101.

The VCSEL1 through VCSEL128 of the light-emitting portion 102 and the setting thyristors S1 through S128, transfer thyristors T1 through T128, under diodes UD1 through UD128, coupling diodes D1 through D127, and power supply line resistors Rg1 through Rg128 of the drive portion 101 are shown in numerical order from the left side of FIG. 5.

In the exemplary embodiment, the number of VCSELs of the light-emitting portion 102 and the numbers of setting thyristors S, transfer thyristors T, under diodes UD, and power supply line resistors Rg of the drive portion 101 are all 128. The number of coupling diodes D is 127, which is one less than the number of the above-described elements.

However, the above-described numbers are only examples, and a predetermined number of each of the above-described elements may be set. The number of transfer thyristors T may be greater than that of VCSELs.

Each of the VCSELs, under diodes UD, coupling diodes D, and start diode SD is a semiconductor element formed in the structure of a diode with two terminals, that is, an anode terminal (anode) and a cathode terminal (cathode). Each of the setting thyristors S and transfer thyristors T is a semiconductor element formed in the structure of a thyristor with three terminals, that is, an anode terminal (anode), a gate terminal (gate), and a cathode terminal (cathode).

The VCSELs, under diodes UD, coupling diodes D, start diode SD, setting thyristors S, and transfer thyristors T do not necessarily have an anode terminal, a gate terminal, and a cathode terminal formed as electrodes. Hereinafter, the anode terminal, gate terminal, and cathode terminal may thus be called an anode, a gate, and a cathode, respectively.

Electrical connection between the individual elements of the light-emitting chip C1(C) will be discussed below.

The anodes of the VCSELs and the under diodes UD are connected to the substrate 80 of the light-emitting chip C1(C) (common anode).

The anodes are connected to the power supply line 200a (see FIG. 4B) via the back-surface electrode 91 (see FIG. 6B), which serves as the Vsub terminal, provided on the back surface of the substrate 80. The power supply line 200a receives the reference potential Vsub from the reference potential supplier 160.

The cathodes of the VCSELs are connected to the anodes of the corresponding setting thyristors S. The cathodes of the under diodes UD are connected to the anodes of the corresponding transfer thyristors T.

The above-described electrical connection is applicable when a p-type substrate is used as the substrate 80. If an n-type substrate is used as the substrate 80, the above-described polarities are reversed. If an intrinsic (i) substrate without impurities is used as the substrate 80, terminals to be connected to the power supply line 200a for supplying the reference potential Vsub are provided on the side of the substrate 80 on which the drive portion 101 and the light-emitting portion 102 are formed.

In accordance with the arrangement of the transfer thyristors T, the cathodes of the odd-numbered transfer thyristors T1, T3, ... are connected to the first transfer signal line 72. The first transfer signal line 72 is connected to the φ1 terminal via the current limiting resistor R1. The first transfer signal line 201 (see FIG. 4B) of the light-emitting device 65 is connected to the φ1 terminal, and the first transfer signal φ1 is sent from the transfer signal generator 120 to the φ1 terminal via the first transfer signal line 201.

In accordance with the arrangement of the transfer thyristors T, the cathodes of the even-numbered transfer thyristors T2, T4, ... are connected to the second transfer signal line 73. The second transfer signal line 73 is connected to the φ2 terminal via the current limiting resistor R2. The second transfer signal line 202 (see FIG. 4B) of the light-emitting device 65 is connected to the φ2 terminal, and the second transfer signal φ2 is sent from the transfer signal generator 120 to the φ2 terminal via the second transfer signal line 202.

The cathodes of the setting thyristors S are connected to an ON signal line 75. The ON signal line 75 is connected to the φI terminal. In the light-emitting chip C1, the φI terminal is connected to the ON signal line 204-1 of the light-emitting device 65 via the current limiting resistor RI provided outside the light-emitting chip C1(C), and an ON signal φI1 is sent from the ON signal generator 140 to the φI terminal (see FIG. 4B) via the ON signal line 204-1. The ON signal φI1 supplies a current to the φI terminal to turn ON the VCSEL1 through VCSEL128. The ON signal lines 204-2 through 204-40 of the light-emitting device 65 are respectively connected to the φI terminals of the other light-emitting chips C2 through C40 via the respective current limiting resistors RI, and ON signals φI2 through φI40 are sent from the ON signal generator 140 to the φI terminals of the other light-emitting chips C2 through C40, respectively, via the ON signal lines 204-2 through 204-40 (see FIG. 4B).

Gates Gt1 through Gt128 (simply called gates Gt unless it is necessary to distinguish them from each other) of the transfer thyristors T1 through T128 are respectively connected to gates Gs1 through Gs128 (simply called gates Gs unless it is necessary to distinguish them from each other) of the setting thyristors S1 through S128. Accordingly, the gate Gt and the gate Gs having the same number are electrically at the same potential. For example, the gate Gt1 (gate Gs1) indicates that the gates Gt1 and Gs1 are at the same potential.

The gates Gt1 through Gt128 of the transfer thyristors T1 through T128 are divided into pairs in numerical order, and the coupling diodes D1 through D127 are each connected between the gates Gt of the corresponding pair. That is, the coupling diodes D1 through D127 are connected in series with each other so that they are each sandwiched between the gates Gt of the corresponding pair. The coupling diode D1 is connected in the direction in which a current flows from the gate Gt1 to the gate Gt2. The other coupling diodes D2 through D127 are connected in a similar manner.

The gates Gt (gates Gs) of the transfer thyristors T are connected to a power supply line 71 via the power supply line resistors Rg provided for the respective transfer thyristors T. The power supply line 71 is connected to the Vgk terminal. The power supply line 200b (see FIG. 4B) of the light-emitting device 65 is connected to the Vgk terminal, and the power supply potential Vgk is supplied from the power supply potential supplier 170 to the Vgk terminal via the power supply line 200b.

The gate Gt1 of the transfer thyristor T is connected to the cathode of the start diode SD. The anode of the start diode SD is connected to the second transfer signal line 73.

Figure 6A:
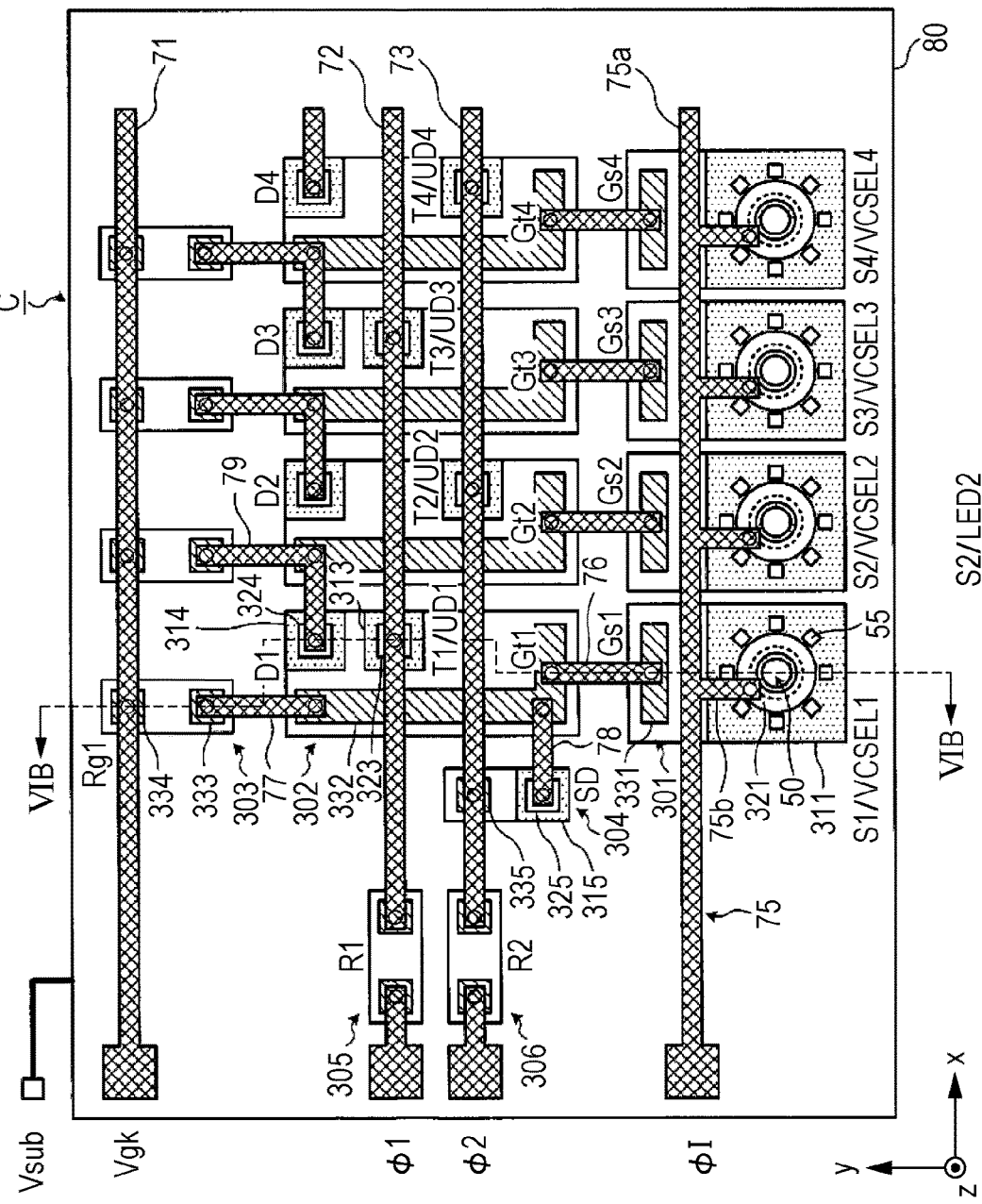
FIG. 6A is a plan view illustrating an example of the layout of the light-emitting chip of the exemplary embodiment.

FIG. 6A is a plan view illustrating an example of the layout of the light-emitting chip C of the exemplary embodiment. FIG. 6B is a sectional view taken along line VIB-VIB in FIG. 6A. The connection relationship between the light-emitting chip C and the signal generating circuit 110 is not shown in FIGS. 6A and 6B, and the light-emitting chip C can thus be explained without taking the light-emitting chip C1 as an example. In FIG. 6A, in the plane of the drawing, the rightward direction is the x direction, the upward direction is the y direction, and the depth direction is the z direction. The light-emitting chip C in FIG. 6A is thus viewed in the z direction. In FIG. 6B, in the plane of the drawing, the leftward direction is the z direction, and the upward direction is the y direction.

In FIG. 6A, the VCSEL1 through VCSEL4, setting thyristors S1 through S4, transfer thyristors T1 through T4, and under diodes UD1 through UD4 and terminals and lines around these elements are shown. The terminals (φ1 terminal, φ2 terminal, Vgk terminal, and φI terminal) are shown in the order indicated as that at the left side of FIG. 6A for the sake of description, though the positions thereof are different from those in FIG. 4A. The Vsub terminal (back-surface electrode 91) provided on the back surface of the substrate 80 is shown outside the substrate 80. If the terminals are shown based on the arrangement in FIG. 4A, the φ2 terminal, φI terminal, and current-limiting resistor R2 are disposed on the right side of the substrate 80. The start diode SD may be disposed on the right side of the substrate 80.

From the bottom side of FIG. 6B, which is taken along line VIB-VIB in FIG. 6A, a group of the setting thyristor S1 and the VCSEL1, a group of the transfer thyristor T1 and the under diode UD1, the coupling diode D1, and the power supply line resistor Rg1 are shown. The setting thyristor S1 and the VCSEL1 are stacked on each other. Likewise, the transfer thyristor T and the under diode UD1 are stacked on each other. In FIGS. 6A and 6B, the principal elements and terminals are designated by symbols. On the front surface of the substrate 80, the VCSELs (VCSEL1 through VCSEL4) are arranged in the x direction.

The cross-sectional structure of the light-emitting chip C will first be discussed below with reference to FIG. 6B.

On a p-type substrate 80, a p-type DBR anode layer (p-anode DBR layer) 81, a light-emitting layer 82, and an n-type DBR cathode layer (n-cathode DBR layer) 83, which form the VCSEL and the under diodes UD, are disposed. A tunnel junction (tunnel diode) layer 84 is disposed on top of the n-cathode DBR layer 83. On top of the tunnel junction layer 84, a p-type anode layer (p-anode layer) 85, an n-type gate layer (n-gate layer) 86, a p-type gate layer (p-gate layer) 87, and an n-type cathode layer (n-cathode layer) 88, which form the setting thyristor S, transfer thyristor T, coupling diode D1, and power supply line resistor Rg1, are sequentially disposed. Semiconductor layers constituted by the p-anode DBR layer 81, light-emitting layer 82, n-cathode DBR layer 83, tunnel junction layer 84, p-anode layer 85, n-gate layer 86, p-gate layer 87, and n-cathode layer 88 stacked on each other will be called a semiconductor multilayer body.

As shown in FIG. 6B, a protective layer 90 made of an insulating material transparent to light is disposed on the light-emitting chip C. The protective layer 90 is disposed to cover the front surfaces and side surfaces of multilayer structures which are separated from the semiconductor multilayer body. The emitting direction of light from the VCSEL is indicated by the arrow in FIG. 6B. The light emitting direction is the direction (z direction in FIG. 6B) perpendicular to the front surface of the substrate 80.

The multilayer structures and lines, such as the power supply line 71, first and second transfer signal lines 72 and 73, and ON signal line 75, are connected with each other via through-holes (indicated by the circles in FIG. 6A). An explanation of the protective layer 90 and through-holes will be omitted.

As shown in FIG. 6B, the back-surface electrode 91, which serves as the Vsub terminal, is disposed on the back surface of the substrate 80.

The p-anode DBR layer 81, light-emitting layer 82, n-cathode DBR layer 83, tunnel junction layer 84, p-anode layer 85, n-gate layer 86, p-gate layer 87, and n-cathode layer 88 are individual semiconductor layers and are monolithically deposited by epitaxial growth. The semiconductor multilayer body positioned between multilayer structures to be formed is removed by etching (mesa etching) so as to form multiple multilayer structures (islands) 301, 302, 303, . . . , electrically separated from each other. The semiconductor multilayer body positioned between multilayer structures to be formed may be removed by ion implantation instead of etching.

The p-anode DBR layer 81 and the n-cathode DBR layer 83 are named in accordance with the functions of the VCSEL. That is, the p-anode DBR layer 81 functions as the anode of the VCSEL, while the n-cathode DBR layer 83 functions as the cathode of the VCSEL. That is, the VCSEL is formed in the structure of a diode with an anode and a cathode. The under diode UD, as well as the VCSEL, is also formed in the structure of a diode.

The p-anode layer 85, n-gate layer 86, p-gate layer 87, and n-cathode layer 88 are named in accordance with the functions of the setting thyristor S and the transfer thyristor T. That is, the p-anode layer 85 serves as the anode, the n-gate layer 86 and the p-gate layer 87 serve as the gate, and the n-cathode layer 88 serves as the cathode.

When the p-anode layer 85, n-gate layer 86, p-gate layer 87, and n-cathode layer 88 also form the coupling diode D and the power supply line resistor Rg, they have different functions, which will be discussed later.

Not all the multilayer structures have the entirety of each of the above-described p-anode DBR layer 81, light-emitting layer 82, n-cathode DBR layer 83, tunnel junction layer 84, p-anode layer 85, n-gate layer 86, p-gate layer 87, and n-cathode layer 88. For example, the multilayer structure 301 does not have part of each of the tunnel junction layer 84, p-anode layer 85, n-gate layer 86, p-gate layer 87, and n-cathode layer 88, as shown in FIG. 6B. This will be discussed in detail later.

The planar layout of the light-emitting chip C will be described below with reference to the plan view of FIG. 6A.

The multilayer structure 301 includes the VCSEL1 and the setting thyristor S1. The multilayer structure 302 includes the under diode UD1, transfer thyristor T1, and coupling diode D1. The multilayer structure 303 includes the power supply line resistor Rg1. The multilayer structure 304 includes the start diode SD. The multilayer structure 305 includes the current limiting resistor R1. The multilayer structure 306 includes the current limiting resistor R2.

In the light-emitting chip C, plural multilayer structures similar to the multilayer structures 301, 302, and 303 are formed in parallel with each other. Such plural multilayer structures include the VCSEL2, VCSEL3, VCSEL4, . . . , the setting thyristors S2, S3, S4, . . . , the transfer thyristors T2, T3, T4, . . . , the under diodes UD2, UD3, UD4, . . . , the coupling diodes D2, D3, D4, . . . , and so on, as in the multilayer structures 301, 302, and 303.

The multilayer structures 301 through 306 will be discussed in detail with reference to FIGS. 6A and 6B.

As shown in FIG. 6B, the VCSEL1 formed in the multilayer structure 301 is constituted by the p-anode DBR layer 81, light-emitting layer 82, and n-cathode DBR layer 83. The setting thyristor S1 is constituted by the p-anode layer 85, n-gate layer 86, p-gate layer 87, and n-cathode layer 88 stacked on each other on the n-cathode DBR layer 83 of the VCSEL1 with the tunnel junction layer 84 therebetween.

The p-anode DBR layer 81 forming the VCSEL includes a current confinement layer (current confinement layer 81*b* in FIGS. 7B and 7C), which confines a current, as indicated by the black portions in FIG. 6B. The current confinement layer serves to concentrate a current flowing through the VCSEL on the central portion of the VCSEL. The peripheral portion of the VCSEL suffers from many defects due to mesa etching and are thus likely to cause the occurrence of non-radiative recombination. Hence, the current confinement layer is provided so that the central portion of the VCSEL serves as a current passing portion (region) α which makes it easy for a current to flow, while the peripheral portion serves as a current blocking portion (region) β which makes it difficult for a current to flow. The current blocking portion β may be called a current confinement region.

The current blocking portion β reduces power which would be consumed for non-radiative recombination, thereby enhancing power saving and light extraction efficiency. The light extraction efficiency is represented by the amount of light that can be extracted per unit power.

The current confinement layer will be discussed later.

To reduce a loss caused by allowing light from the VCSEL to pass through the setting thyristor S, a cavity 51 is formed in the setting thyristor S at a portion overlapping a light-emitting window 50 from which light from the VCSEL is output. As an example, the cavity 51 is formed at a position overlapping the central portion of the current passing portion α as viewed from the light-emitting surface. The cavity 51 passes through the n-cathode layer 88, p-gate layer 87, n-gate layer 86, p-anode layer 85, and tunnel junction layer 84. That is, the cavity 51 is surrounded by the setting thyristor S. The cavity 51 is also positioned on the path through which light from the VCSEL passes. That is, the setting thyristor S is stacked on the VCSEL at a position displaced from the light-emitting window 50 (central portion of the current passing portion α). The light-emitting window 50 can be regarded as a portion where the amount of outgoing light is maximized on the light-emitting surface of the VCSEL. That is, in the setting thyristor S, the cavity 51 is formed at a position which overlaps the area where the amount of outgoing light is maximized on the light-emitting surface of the VCSEL. The provision of the cavity 51 may be omitted. In this case, the setting thyristor S is formed to be transparent to light emitted from the VCSEL, and then, light can pass through the setting thyristor S.

Multiple holes 55 (eight in the exemplary embodiment) are formed in the setting thyristor S1. The eight holes 55 are provided to surround the light-emitting window 50. As in the semiconductor multilayer body between the multilayer structures, the holes 55 are formed by removing the semiconductor multilayer body constituted by the p-anode DBR layer 81, light-emitting layer 82, the n-cathode DBR layer 83, tunnel junction layer 84, p-anode layer 85, n-gate layer 86, p-gate layer 87, and n-cathode layer 88. The current confinement layer 81b is oxidized from the edge portions of the multilayer structure 301 and via the holes 55 so as to form the current blocking portion β. This will be discussed in detail later. The edge portions of the multilayer structure 301 are portions at the edges of the multilayer structure 301 formed by removing the semiconductor multilayer body. That is, the edge portions of the multilayer structure 301 correspond to the side surfaces of the multilayer structure 301 on which the semiconductor multilayer body is exposed.

An n-type ohmic electrode (n-ohmic electrode) 321 provided on the n-cathode layer 88 (region 311) is used as the cathode terminal of the setting thyristor S1. The n-ohmic electrode 321 is provided between the light-emitting window 50 and the holes 55 so as to surround the light-emitting window 50. A p-type ohmic electrode (p-ohmic electrode) 331 provided on the p-gate layer 87 which is exposed by removing the n-cathode layer 88 is used as the gate Gs1 of the setting thyristor S1.

The under diode UD1 provided in the multilayer structure 302 is constituted by the p-anode DBR layer 81, light-emitting layer 82, and n-cathode DBR layer 83. The transfer thyristor T1 is constituted by the p-anode layer 85, n-gate layer 86, p-gate layer 87, and n-cathode layer 88 stacked on each other on the n-cathode DBR layer 83 forming the under diode UD1 with the tunnel junction layer 84 therebetween. An n-ohmic electrode 323 provided on the n-cathode layer 88 (region 313) is used as the cathode terminal of the transfer thyristor T1. A p-ohmic electrode 332 provided on the p-gate layer 87 which is exposed by removing the n-cathode layer 88 is used as the terminal of the gate Gt1 (may be called the gate terminal Gt1) of the transfer thyristor T1.

The coupling diode D1 disposed in the multilayer structure 302 is constituted by the p-gate layer 87 and the n-cathode layer 88. An n-ohmic electrode 324 disposed on the n-cathode layer 88 (region 314) is used as the cathode terminal of the coupling diode D1. The p-ohmic electrode 332 disposed on the p-gate layer 87 which is exposed by removing the n-cathode layer 88 is used as the anode terminal of the coupling diode D1. The anode terminal of the coupling diode D1 is the same as the gate Gt1 (gate terminal Gt1).

The power supply line resistor Rg1 provided in the multilayer structure 303 is constituted by the p-gate layer 87. That is, the p-gate layer 87 between p-ohmic electrodes 333 and 334 disposed on the p-gate layer 87 exposed by removing the n-cathode layer 88 is used as the power supply line resistor Rg1.

The start diode SD provided in the multilayer structure 304 is constituted by the p-gate layer 87 and the n-cathode layer 88. That is, an n-ohmic electrode 325 disposed on the n-cathode layer 88 (region 315) is used as the cathode terminal of the start diode SD. A p-ohmic electrode 335 disposed on the p-gate layer 87 exposed by removing the n-cathode layer 88 is used as the anode terminal of the start diode SD.

The current limiting resistor R1 in the multilayer structure 305 and the current limiting resistor R2 in the multilayer structure 306 are provided in a manner similar to the power supply line resistor Rg1 in the multilayer structure 303. The p-gate layer 87 between two p-ohmic electrodes are used as the current limiting resistor R1, while the p-gate layer 87 between two p-ohmic electrodes are used as the current limiting resistor R2.

The connection relationship between the individual elements will be discussed below with reference to FIG. 6A.

The ON signal line 75 includes a trunk portion 75a and plural branch portions 75b. The trunk portion 75a is provided to extend in the row direction of the setting thyristors S and the VCSELs. The branch portions 75b each branch off from the trunk portion 75a, and one branch portion 75b is connected to the corresponding n-ohmic electrode 321, which also serves as the cathode terminal of the setting thyristor S1 provided in the multilayer structure 301. The other branch portions 75b are also connected to the corresponding n-ohmic electrodes 321, which are the cathode terminals of the other setting thyristors S.

The ON signal line 75 is connected to the ϕI terminal disposed close to the setting thyristor S1 and the VCSEL1.

The first transfer signal line 72 is connected to the n-ohmic electrode 323, which serves as the cathode terminal of the transfer thyristor T1 provided in the multilayer structure 302. The first transfer signal line 72 is also connected to the cathode terminals of the other odd-numbered transfer thyristors T provided in the corresponding multilayer structures similar to the multilayer structure 302. The first transfer signal line 72 is connected to the ϕ1 terminal via the current limiting resistor R1 provided in the multilayer structure 305.

The second transfer signal line 73 is connected to n-ohmic electrodes, which serve as the cathode terminals of the even-numbered transfer thyristors T provided in multilayer structures. The second transfer signal line 73 is connected to the φ2 terminal via the current limiting resistor R2 provided in the multilayer structure 306.

The power supply line 71 is connected to the p-ohmic electrode 334, which is one terminal of the power supply line resistor Rg1, provided in the multilayer structure 303. The power supply line 71 is also connected to one terminal of each of the other power supply line resistors Rg. The power supply line 71 is connected to the Vgk terminal.

The p-ohmic electrode 331 (gate terminal Gs1) of the setting thyristor S1 provided in the multilayer structure 301 is connected via a connecting line 76 to the p-ohmic electrode 332 (gate terminal Gt1) of the transfer thyristor T1 provided in the multilayer structure 302.

The p-ohmic electrode 332 (gate terminal Gt1) is connected via a connecting line 77 to the p-ohmic electrode 333, which is the other terminal of the power supply line resistor Rg1, provided in the multilayer structure 303.

The n-ohmic electrode 324 (cathode terminal of the coupling diode D1) provided in the multilayer structure 302 is connected via a connecting line 79 to a p-type ohmic electrode, which is the gate terminal Gt2 of the adjacent transfer thyristor T2.

Regarding the other VCSELs, the other thyristors S, the other transfer thyristors T, and the other coupling diodes D, the connection relationship between the elements is similar to that described above, though an explanation thereof is omitted.

The p-ohmic electrode 332 (gate terminal Gt1) in the multilayer structure 302 is connected via a connecting line 78 to the n-ohmic electrode 325 (cathode terminal of the start diode SD) in the multilayer structure 304. The p-ohmic electrode 335 (anode terminal of the start diode SD) is connected to the second transfer signal line 73.

The above-described connection and configuration of the light-emitting chip C are applicable when a p-type substrate is used as the substrate 80. If an n-type substrate is used as the substrate 80, the above-described polarities are reversed. If an i-type substrate is used as the substrate 80, terminals to be connected to the power supply line 200a for supplying the reference potential Vsub are provided on the side of the substrate 80 on which the drive portion 101 and the light-emitting portion 102 are formed. The connection and configuration of the light-emitting chip C in this case are those when a p-type substrate is used or those when an n-type substrate is used.

A manufacturing method for the light-emitting chip C will be described below with reference to FIG. 6B.

On the p-type substrate 80, the p-anode DBR layer 81, light-emitting layer 82, n-cathode DBR layer 83, tunnel junction layer 84, p-anode layer 85, n-gate layer 86, p-gate layer 87, and n-cathode layer 88 are sequentially deposited by epitaxial growth, thereby forming a semiconductor multilayer body. The manufacturing method will be discussed, assuming that the substrate 80 is a p-type GaAs substrate. Alternatively, an n-type GaAs substrate or an i-type GaAs substrate may be used.

The DBR layers are each formed of a low-refractive-index layer having a composition of a high Al content, such as $Al_{0.9}Ga_{0.1}As$, and a high-refractive-index layer having a composition of a low Al content, such as $Al_{0.2}Ga_{0.8}As$. The film thickness (optical path length) of each of the low-refractive-index layer and the high-refractive-index layer are set to be 0.25 (one fourth) of the central wavelength. The Al content ratio in the composition of the low-refractive-index layer and that of the high-refractive-index layer may be changed in a range of 0 to 1.

The p-anode DBR layer 81 is constituted by a lower p-anode DBR layer 81a, the current confinement layer 81b, and an upper p-anode DBR layer 81c (see FIGS. 7B and 7C) sequentially stacked on each other. The impurity concentration of the lower p-anode DBR layer 81a and the upper p-anode DBR layer 81c is $1\times10^{18}/cm^3$, for example. The current confinement layer 81b is made of p-type AlGaAs having a high impurity concentration of AlAs or Al. The current confinement layer 81b may be made of another compound as long as it can confine the current path due to the high electrical resistance after the formation of $Al_2O_3$ through the oxidation of Al.

The film thickness (optical path length) of the current confinement layer 81b of the p-anode DBR layer 81 is determined in accordance with the purpose of the provision of the current confinement layer 81b. If the light extraction efficiency or the process reproducibility is prioritized, it is appropriate that the film thickness of the current confinement layer 81b be set to be an integral multiple of the film thickness (optical path length) of each of the low-refractive-index layer and the high-refractive-index layer, for example, it is set to be 0.75 (three quarters) of the central wavelength. If the film thickness of the current confinement layer 81b is set to be an odd-number integral multiple of the film thickness (optical path length) of each of the low-refractive-index layer and the high-refractive-index layer, it is appropriate that the current confinement layer 81 be sandwiched between high-refractive index layers. If the film thickness of the current confinement layer 81b is set to be an even-number integral multiple of the film thickness (optical path length) of each of the low-refractive-index layer and the high-refractive-index layer, it is appropriate that the current confinement layer 81 be sandwiched between a high-refractive index layer and a low-refractive index layer. That is, the current confinement layer 81b is suitably disposed to reduce the periodic variation of the refractive index caused by the DBR layer. In contrast, if reducing of the influences of the oxidized portion of the current confinement layer 81b (such as the refractive index or distortion) is prioritized, it is appropriate that the film thickness of the current confinement layer 81b be set to be several dozens of nanometers and the current confinement layer 81b be located at the nodes of a standing wave generated in the DBR layer.

The light-emitting layer 82 has a quantum well structure in which well layers and barrier layers are alternately disposed on each other. The well layers are made of GaAs, AlGaAs, InGaAs, GaAsP, AlGaInP, GaInAsP, or GaInP, for example. The barrier layers are made of AlGaAs, GaAs, GaInP, or GaInAsP, for example. The light-emitting layer 82 may be formed as quantum wires or quantum dots.

The n-cathode DBR layer 83 has an impurity concentration of $1\times10^{18}/cm^3$, for example.

Figure 8A:
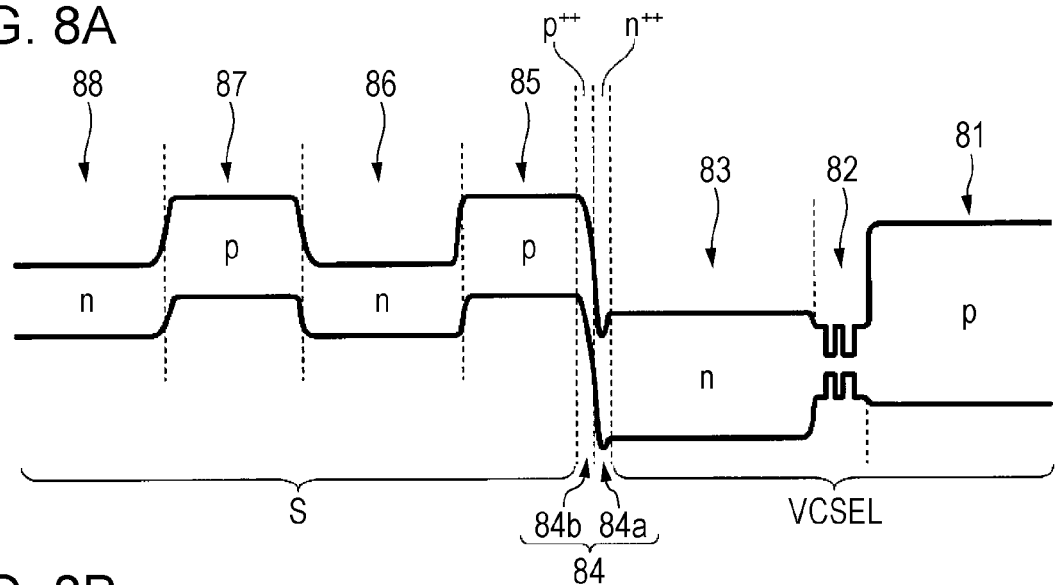
FIG. 8A is a schematic diagram showing the energy band in a multilayer structure of a VCSEL and a setting thyristor.

The tunnel junction layer 84 is a junction between an $n^{++}$ layer 84a with an additive of a high-concentration n-type impurity and a $p^{++}$ layer 84b with an additive of a high-concentration p-type impurity (see FIG. 8A). The $n^{++}$ layer 84a and the $p^{++}$ layer 84b have an impurity concentration as high as $1\times10^{20}/cm^3$. The impurity concentration of a regular junction layer is on the order of $10^{17}/cm^3$ to on the order of $10^{18}/cm^3$. Examples of a combination of the $n^{++}$ layer 84a and the $p^{++}$ layer 84b (hereinafter indicated by $n^{++}$ layer 84a/$p^{++}$ layer 84b) are $n^{++}$GaInP/$p^{++}$GaAs, $n^{++}$GaInP/$p^{++}$AlGaAs, $n^{++}$GaAs/$p^{++}$GaAs, $n^{++}$AlGaAs/$p^{++}$AlGaAs, $n^{++}$InGaAs/$p^{++}$InGaAs, $n^{++}$GaInAsP/$p^{++}$GaInAsP, and $n^{++}$GaAsSb/$p^{++}$GaAsSb. The above-described combinations are interchangeable.

The p-anode layer 85 is made of p-type $Al_{0.9}GaAs$ having an impurity concentration of $1\times10^{18}/cm^3$, for example. The Al content may be changed from 0 to 1.

The n-gate layer 86 is made of n-type $Al_{0.9}GaAs$ having an impurity concentration of $1\times10^{17}/cm^3$, for example. The Al content may be changed from 0 to 1.

The p-gate layer 87 is made of p-type $Al_{0.9}GaAs$ having an impurity concentration of $1\times10^{17}/cm^3$, for example. The Al content may be changed from 0 to 1.

The n-cathode layer 88 is made of n-type $Al_{0.9}GaAs$ having an impurity concentration of $1\times10^{18}/cm^3$, for example. The Al content may be changed from 0 to 1.

These semiconductor layers are deposited by metal organic chemical vapor deposition (MOCVD) or molecular beam epitaxy (MBE), for example, thereby forming a semiconductor multilayer body.

Then, n-ohmic electrodes, such as the n-ohmic electrodes 321, 323, and 324, are formed on the n-cathode layer 88. The n-ohmic electrodes are made of Au with a content of Ge (AuGe), which easily achieves ohmic contact with an n-type semiconductor layer, such as the n-cathode layer 88. The n-ohmic electrodes are formed by the lift-off process, for example.

Then, the n-cathode layer 88, p-gate layer 87, n-gate layer 86, p-anode layer 85, tunnel junction layer 84, n-cathode DBR layer 83, light-emitting layer 82, and p-anode DBR layer 81 are sequentially subjected to etching, so that the semiconductor multilayer body is separated into plural multilayer structures, such as the multilayer structures 301 and 302. At the same time, the holes 55 are formed in the multilayer structure 301. To perform the above-described etching, wet etching using a sulfuric-acid etchant (the weight ratio of the etchant between sulfuric acid:hydrogen peroxide solution:water is 1:10:300) may be used, or anisotropic dry etching (reactive-ion etching (RIE)) using boron trichloride may be used. Etching to separate the semiconductor multilayer body into multilayer structures may also be called mesa etching or post etching.

Then, the n-cathode layer 88, p-gate layer 87, n-gate layer 86, p-anode layer 85, and tunnel junction layer 84 are sequentially subjected to etching, so that the cavity 51 is formed in the light-emitting window 50.

The current confinement layer 81b is oxidized from the edge portions of the multilayer structure and via the holes 55, that is, from the exposed side surfaces of the current confinement layer 81b, thereby forming the current blocking portion β. To oxidize the current confinement layer 81b, Al in AlAs or AlGaAs forming the current confinement layer 81b is oxidized by water vapor oxidation under a temperature of 300 to 400° C. Oxidation progresses from the exposed side surfaces of the current confinement layer 81b, thereby forming the current blocking portion β made of $Al_2O_3$. The portion of the current confinement layer 81b which is not oxidized serves as the current passing portion α.

Then, the n-cathode layer 88 is subjected to etching so that the p-gate layer 87 is exposed. To perform this etching, wet etching using a sulfuric-acid etchant (the weight ratio of the etchant between sulfuric acid:hydrogen peroxide solution:water is 1:10:300) may be used, or anisotropic dry etching using boron trichloride may be used. As a result of this etching, p-ohmic electrodes, such as the p-ohmic electrodes 331 and 332, are formed on the p-gate layer 87. The p-ohmic electrodes are made of Au with a content of Zn (AuZn), which easily achieves ohmic contact with an p-type semiconductor layer, such as the p-gate layer 87. The p-ohmic electrodes are formed by the lift-off process, for example.

Thereafter, by using an insulating material, such as $SiO_2$, SiON, or SiN, the protective layer 90 is formed to cover the surfaces of the multilayer structures, such as the multilayer structures 301 and 302. Then, through-holes are formed in the protective layer 90 on the n-ohmic electrodes, such as n-ohmic electrodes 321, 323, and 324, and the p-ohmic electrodes, such as p-ohmic electrodes 331 and 332. Lines, such as the power supply line 71, first and second transfer signal lines 72 and 73, and ON signal line 75, for connecting the n-ohmic electrodes and the p-ohmic electrodes via the through-holes formed in the protective layer 90 are formed, and the back-surface electrode 91 is formed. The lines and the back-surface electrode 91 are made of Al or Au.

The light-emitting chip C is manufactured as described above.

As the substrate 80, InP, GaN, InAs, other III-V compounds, and II-VI compounds, sapphire, Si, and Ge may be used. If a substrate made of a compound different from GaAs is used, materials having a lattice constant and other properties of the crystal lattice, such as the distortion structure, distortion relaxing layer, and metamorphic growth, which substantially match those of the substrate are used as materials forming the semiconductor multilayer body monolithically stacked on the substrate. As an example, InAs, InAsSb, and GaInAsSb may be used on an InAs substrate; InP and InGaAsP may be used on an InP substrate; GaN, AlGaN, and InGaN may be used on a GaN or sapphire substrate; and Si, SiGe, and GaP may be used on a Si substrate. If the semiconductor layers subjected to crystal growth are bonded to another support substrate, it is not necessary that the lattice constant of materials forming the semiconductor layers substantially match that of the support substrate.

(Multilayer Structure of VCSEL and Setting Thyristor S)

FIGS. 7A through 7C are enlarged views of the multilayer structure 301 constituted by the VCSEL and the setting thyristor S stacked on each other in the light-emitting chip C of the exemplary embodiment. FIG. 7A is a plan view of the multilayer structure 301. FIG. 7B is a sectional view taken along line VIIB-VIIB in FIG. 7A. FIG. 7C is a sectional view taken along line VIIC-VIIC in FIG. 7A. As described above, in the multilayer structure 301, the VCSEL and the setting thyristor S are stacked on each other. The protective layer 90 and the ON signal line 75 are not shown in FIGS. 7A through 7C.

As shown in FIG. 7A, the eight holes 55 are formed in the multilayer structure 301. As shown in FIG. 7B, the holes 55 are formed to reach the substrate 80 as a result of removing the n-cathode layer 88, p-gate layer 87, n-gate layer 86, p-anode layer 85, tunnel junction layer 84, n-cathode DBR layer 83, light-emitting layer 82, and p-anode DBR layer 81 by etching. The current confinement layer 81b forming the p-anode DBR layer 81 is oxidized via the holes 55 and then continues to oxidize around the holes 55. In FIG. 7A, the leading ends of the oxidized portion (current blocking portion β) extending toward the light-emitting window 50 where the cavity 51 is formed are indicated by the dotted line. That is, the central portion surrounded by the eight holes 55 serves as the portion which is not oxidized (current passing portion α).

As shown in FIGS. 7B and 7C, the current confinement layer 81b is oxidized from the side surfaces of the multilayer structure 301 and via the holes 55, thereby forming the current blocking portion β in the current confinement layer 81$b$, except for the current passing portion α corresponding to the light-emitting window 50.

As shown in FIG. 7A, the multiple holes 55 are located on a circle 56 which surrounds the light-emitting window 50, so that the planar shape of the portion which is not oxidized (current passing portion α) becomes close to a circle. In the VCSEL, as the light-emitting window 50 is closer to a smaller circle, the VCSEL is more likely to oscillate in a single mode. The resulting strength distribution is thus more likely to be unimodal. To achieve this, it is appropriate that the multiple holes 55 be located on the circle 56 to make the current passing portion α closer to a circle.

The p-anode layer 85, n-gate layer 86, p-gate layer 87, and n-cathode layer 88 of the multilayer structure 301, except for the cavity 51 and the holes 55, serve as the setting thyristor S. The n-cathode DBR layer 83, light-emitting layer 82, and upper p-anode DBR layer 81$c$ located above the current confinement layer 81$b$ serve as the current path. Accordingly, as the multilayer structure 301 other than the cavity 51 and the holes 55 is larger, the resistance to a current flowing from the setting thyristor S to the VCSEL becomes lower. The number of holes 55 is determined in accordance with the shape of the portion which is not oxidized (current passing portion α) and the resistance in the path through which a current flows from the setting thyristor S to the VCSEL via the tunnel junction layer 84. At least four holes 55 are required. Although the planar shape of the holes 55 is a square in FIG. 7A, it may be formed in another shape, such as a circle or a rectangle. If the planar shape of the holes 55 is a square, one side may be about 5 μm.

[Tunnel Junction Layer 84]

Figure 8B:
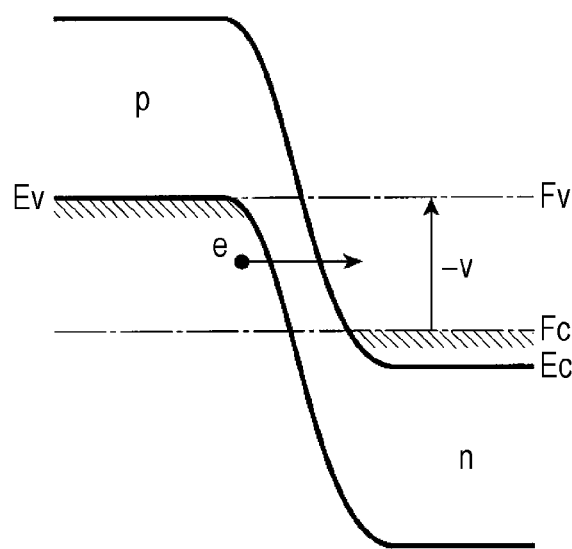
FIG. 8B is a diagram showing the energy band when a tunnel junction layer is in a reverse bias state.
Figure 8C:
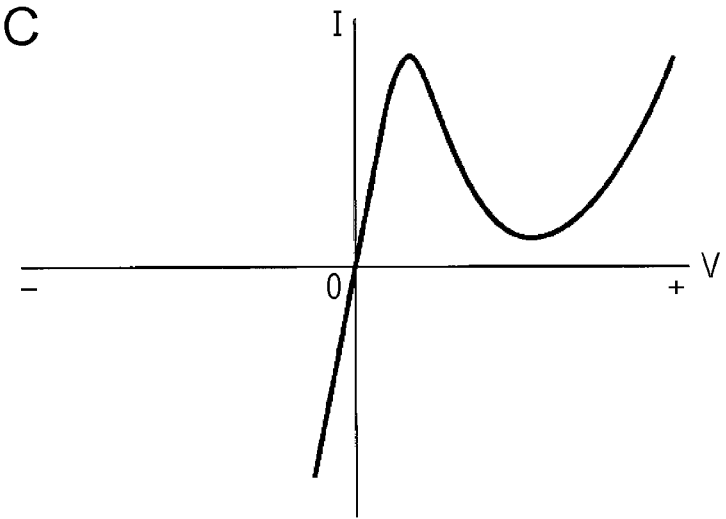
FIG. 8C is a diagram showing the current-voltage characteristics of the tunnel junction layer.

FIGS. 8A through 8C are diagrams for explaining the multilayer structure of the VCSEL and the setting thyristor S. FIG. 8A is a schematic diagram showing the energy band in the multilayer structure of the VCSEL and the setting thyristor S. FIG. 8B is a diagram showing the energy band when the tunnel junction layer 84 is in the reverse bias state. FIG. 8C is a diagram showing the current-voltage characteristics of the tunnel junction layer 84.

As shown in FIG. 8A, with the application of a voltage to between the n-ohmic electrode 321 and the back-surface electrode 91 shown in FIGS. 7B and 7C so that the VCSEL and the setting thyristor S are forward biased, the tunnel junction layer 84 constituted by the n$^{++}$ layer 84$a$ and the p$^{++}$ layer 84$b$ is reverse biased.

The tunnel junction layer 84 is a junction between the n$^{++}$ layer 84$a$ with an additive of a high-concentration n-type impurity and the p$^{++}$ layer 84$b$ with an additive of a high-concentration p-type impurity. The width of the depletion region is thus narrow, and when the tunnel junction layer 84 is forward biased, electrons tunnel through the depletion region from the conduction band of the n$^{++}$ layer 84$a$ to the valence band of the p$^{++}$ layer 84$b$. At this time, the negative resistance characteristics are exhibited.

In contrast, as shown in FIG. 8B, when the tunnel junction layer 84 (tunnel junction) is reversed biased (−V), the electric potential Ev of the valence band of the p$^{++}$ layer 84$b$ becomes higher than the electric potential Ec of the conduction band of the n$^{++}$ layer 84$a$. Electrons thus tunnel through the depletion region from the valence band of the p$^{++}$ layer 84$b$ to the conduction band of the n$^{++}$ layer 84$a$. As the reverse bias voltage (−V) rises, electrons are more likely to tunnel through the depletion region. That is, a current is more likely to flow through the tunnel junction layer 84 (tunnel junction) in the reverse bias state, as shown in FIG. 8C.

As shown in FIG. 8A, when the setting thyristor S is turned ON, a current flows between the VCSEL and the setting thyristor S even though the tunnel junction layer 84 is in the reverse bias state. This causes the VCSEL to emit light (be turned ON).

As described below, the setting thyristor S becomes ready to be turned ON when the transfer thyristor T connected to the setting thyristor S is turned ON. When the ON signal ϕI is made to have a low level "L", the setting thyristor S is turned ON, which causes the VCSEL to emit light (be turned ON). In other words, the setting thyristor S sets the state of the VCSEL to be ON, as the name suggests.

The relationship between the under diode UD and the transfer thyristor T is the same as that between the VCSEL and the setting thyristor S. Unlike the VCSEL, however, light emission of the under diode UD is not utilized. If a leakage of light emitted from the under diode UD is found, a smaller size of the under diode UD is used or the material for the wiring is adjusted to block light from the under diode UD.

Instead of the tunnel junction layer 84, a metallic-conductive III-V compound layer, which is epitaxially grown on a III-V compound semiconductor layer, may be used. InNAs is an example of the metallic-conductive III-V compound layer. The band gap energy of InNAs becomes negative when the ratio x of InN is about 0.1 to 0.8. The band gap energy of InNSb becomes negative when the ratio x of InN is about 0.2 to 0.75. If the band gap energy of a certain compound is negative, it means that this compound has no band gap. Such a compound thus exhibits conductive characteristics similar to a metal. Exhibiting metallic conductive characteristics means that a current flows in accordance with a potential gradient, as in a metal.

The lattice constant of III-V compounds (semiconductors), such as GaAs and InP, is in a range of 5.6 to 5.9 Å. This range of lattice constant is close to the lattice constant of Si, which is about 5.43 Å, and that of Ge, which is about 5.66 Å.

The lattice constant of InN, which is also an III-V compound, is about 5.0 Å in the sphalerite structure, and that of InAs is about 6.06 Å. Accordingly, the lattice constant of InNAs, which is a compound of InN and InAs, can be close to 5.6 to 5.9 Å, which covers the lattice constant of GaAs.

The lattice constant of InSb, which is also an III-V compound, is about 6.48 Å. The lattice constant of InN is about 5.0 Å. The lattice constant of InNSb, which is a compound of InSb and InN, can be close to 5.6 to 5.9 Å, which covers the lattice constant of GaAs.

That is, InNAs and InNSb can be epitaxially grown monolithically on a III-V compound (semiconductor) layer, such as GaAs. A III-V compound (semiconductor) layer, such as a GaAs layer, can be epitaxially grown monolithically on an InNAs or InNSb layer.

As a result of connecting the setting thyristor S and the VCSEL in series with each other via a metallic-conductive III-V compound layer instead of the tunnel junction layer 84, the n-cathode DBR layer 83 of the VCSEL and the p-anode layer 85 of the setting thyristor S are not reverse biased.

[Thyristor]

The basic operation of the thyristors (transfer thyristor T and setting thyristor S) will be described below. The thyristor is a semiconductor element with three terminals, that is, an anode terminal (anode), a cathode terminal (cathode), and a gate terminal (gate). For example, the thyristor is constituted by p-type semiconductor layers (p-anode layer 85 and p-gate layer 87) and n-type semiconductor layers (n-gate layer 86 and n-cathode layer 88) made of GaAs, GaAlAs, or AlAs, for example, stacked on the substrate 80. That is, the thyristor has a pnpn structure. The thyristor will be explained below, assuming that the forward potential (diffusion potential) Vd of a pn junction constituted by a p-type semiconductor layer and an n-type semiconductor layer is 1.5 V as an example.

In the following description, the reference potential Vsub supplied to the back-surface electrode 91 (see FIG. 6B), which is the Vsub terminal, is a high level potential ("H"), which is 0 V, while the power supply potential Vgk supplied to the Vgk terminal is a low level potential ("L"), which is −5 V, for example. The high level potential may be indicated by "H" (0 V), while the low level potential may be indicated by "L" (−5 V).

The operation of the thyristor alone will first be discussed below. The anode of the thyristor is assumed to be at 0 V.

The thyristor in the OFF state in which a current does not flow between the anode and the cathode shifts to the ON state (is turned ON) when a potential lower than a threshold voltage (that is, a negative potential having a large absolute value) is applied to the cathode. The threshold voltage of the thyristor is the value obtained by subtracting the forward potential Vd (1.5 V) of the pn junction from the gate potential.

When the thyristor is turned ON, the gate of the thyristor is made to have a potential close to the potential of the anode. Since the anode is at 0 V, the gate is also at 0 V. The cathode of the ON-state thyristor is made to be have a potential close to the potential obtained by subtracting the forward potential Vd (1.5 V) of the pn junction from the potential of the anode. Since the anode is at 0 V, the cathode of the ON-state thyristor is at a potential close to −1.5 V (that is, a negative potential having an absolute value greater than 1.5). The potential of the cathode is set in relation to the power source for supplying a current to the ON-state thyristor.

The ON-state thyristor shifts to the OFF state (is turned OFF) when the cathode is made to have a potential higher than the potential required for maintaining the ON state of the thyristor. More specifically, the ON-state thyristor is turned OFF when the cathode is made to have a negative potential having a small absolute value, such as 0 V or a positive potential, which is higher than a potential close to −1.5 V.

In contrast, the thyristor remains in the ON state when a potential (negative potential having a large absolute value) lower than the potential required for maintaining the ON state is continuously applied to the cathode of the ON-state thyristor and the current for maintaining the ON state is supplied to the cathode of the ON-state thyristor.

The operation of the VCSEL and the thyristor S stacked on each other will now be described below.

The setting thyristor S is stacked on and is connected in series with the VCSEL. The potential of the ON signal ϕI is thus distributed over the VCSEL and the setting thyristor S. It is assumed that the voltage applied to the VCSEL is −1.7 V. If the setting thyristor S is in the OFF state, a voltage of −3.3 V is applied to the setting thyristor S.

As discussed above, when the threshold voltage of the setting thyristor S in the OFF state is lower than −3.3 V (when the absolute value of the threshold voltage is greater than 3.3), the setting thyristor S is turned ON. Then, a current flows through the VCSEL and the setting thyristor S connected in series with each other, thereby causing the VCSEL to emit light. In contrast, when the threshold voltage of the setting thyristor S in the OFF state is higher than −3.3 V (when the absolute value of the threshold voltage is smaller than −3.3), the setting thyristor S is not turned ON. The OFF state of the VCSEL is thus maintained, that is, the VCSEL does not emit light.

When the setting thyristor S is turned ON, the voltages applied to the series-connected VCSEL and setting thyristor S are raised (the absolute values of the voltages are smaller) due to the current limiting resistor RI (see FIG. 5). However, if the voltage applied to the setting thyristor S is equal to the voltage required for maintaining the ON state of the setting thyristor S, the ON state of the setting thyristor S is maintained. As a result, the VCSEL keeps emitting light.

The above-described voltages are only examples and are subjected to change in accordance with the wavelength and the amount of light of the VCSEL. In this case, the potential ("L") of the ON signal ϕI is adjusted.

The thyristor is made of a semiconductor, such as GaAs, and may emit light between the n-gate layer 86 and the p-gate layer 87 when it is in the ON state. The amount of light emitted from the thyristor is determined by the area of the cathode and the current flowing between the cathode and the anode. If light emission of the thyristor is not utilized, the area of the cathode may be decreased or the material for the electrode (the n-ohmic electrode 321 of the setting thyristor S1 or the n-ohmic electrode 323 of the transfer thyristor T) or the material for the wiring may be adjusted to block light from the thyristor.

(Operation of Light-Emitting Device 65)

The operation of the light-emitting device 65 will be described below.

As discussed above, the light-emitting device 65 includes the light-emitting chips C1 through C40 (see FIGS. 3 and 4B).

Since the light-emitting chips C1 through C40 are driven in parallel, the operation of the light-emitting chips C1 through C40 will be discussed through illustration of the light-emitting chip C1.

[Timing Chart]

Figure 9:
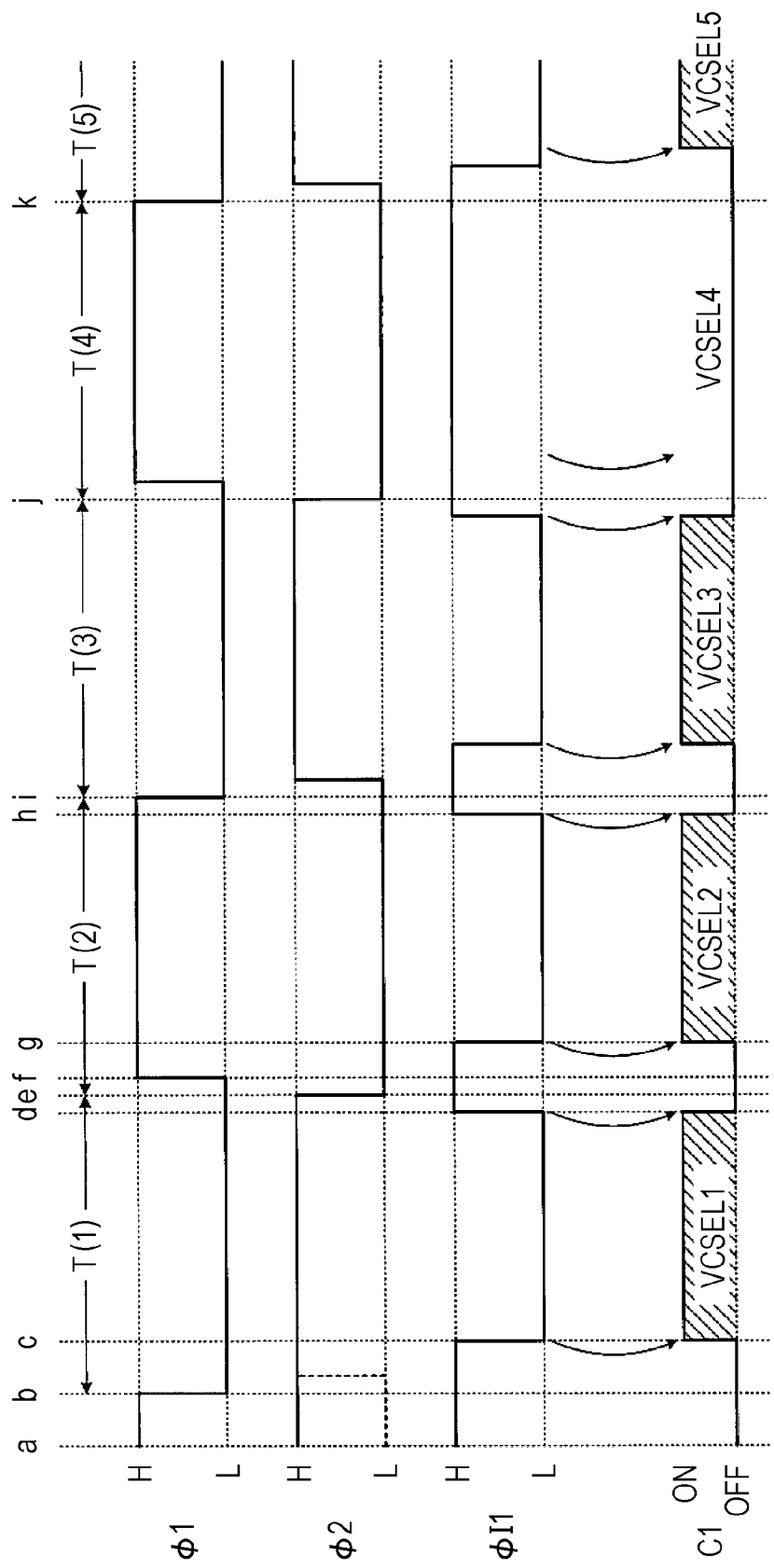
FIG. 9 is a timing chart for explaining the operation of the light-emitting device and the light-emitting chip.

FIG. 9 is a timing chart for explaining the operation of the light-emitting device 65 and the light-emitting chip C.

In FIG. 9, the timing chart for controlling ON (oscillation) and OFF of the five VCSELs (VCSEL1 through VCSEL5) of the light-emitting chip C1 is shown. In FIG. 9, VCSEL1, VCSEL2, VCSEL3, and VCSEL5 are turned ON, while VCSEL4 is turned OFF.

In FIG. 9, the time elapses from time a to time k in alphabetical order. The ON/OFF state of VCSEL1 is controlled in the period T(1), that of VCSEL2 is controlled in the period T(2), that of VCSEL3 is controlled in the period T(3), and that of VCSEL4 is controlled in the period T(4). Likewise, the ON/OFF states of VCSEL5 through VCSEL128 are controlled in the period T(5) through the period T(128), respectively.

The periods T(1), T(2), T(3), . . . have the same length of time. When it is not necessary to distinguish the periods T(1), T(2), T(3), . . . , from each other, they will simply be called the period T.

The first transfer signal ϕ1 sent to the ϕ1 terminal (see FIGS. 5 and 6A) and the second transfer signal ϕ2 sent to the ϕ2 terminal (see FIGS. 5 and 6A) each have two potentials, "H" (0 V) and "L" (−5 V). Regarding the waveform of each of the first and second transfer signals ϕ1 and ϕ2, the waveform in continuous two periods T (period T(1) and period T(2), for example) is set as a unit and is repeated.

Hereinafter, "H" (0 V) and "L" (−5 V) may simply be designated by "H" and "L", respectively.

The first transfer signal ϕ1 shifts from "H" (0 V) to "L" (−5 V) at the start time b of the period T(1), then shifts back from "L" to "H" at time f, and again shifts from "H" to "L" at the end time i of the period T(2).

The second transfer signal φ2 is at "H" (0 V) at the start time b of the period T(1), and then shifts to "L" at time e, and then shifts back to "H" after the end time i of the period T(2) and remains at "H" until time j.

Upon comparing the first and second transfer signals φ1 and φ2 with each other, the second transfer signal φ2 is found to be equal to the transfer signal obtained by moving forward the first transfer signal φ1 for the period T on the time axis. Regarding the second transfer signal φ2 after the period T(3), the waveform indicated by the dotted lines in the period T(1) and that in the period T(2) are repeated. The reason why the waveform of the second transfer signal φ2 in the period (1) differs from those of the period T(3) and the odd-numbered period T is that the period T(1) is a period in which the light-emitting device 65 starts operating.

A pair of the first and second transfer signals φ1 and φ2 sequentially turns ON the transfer thyristors T in numerical order so that ON/OFF control is performed for the VCSEL having the same number as the transfer thyristor T which is turned ON. This will be discussed later.

The ON signal φI1 sent to the φI terminal of the light-emitting chip C1 will be explained below. The ON signals φI2 through φI40 are sent to the other light-emitting chips C2 through C40, respectively. The ON signal φI1 has two potentials ("H" (0 V) and "L" (−5 V)).

The ON signal φI1 will be explained by taking as an example the period T(l) for which the ON/OFF state of the VCSEL1 of the light-emitting chip C1 is controlled. The ON signal φI1 is at "H" (0 V) at the start time b of the period T(1) and shifts from "H" (0 V) to "L" (−5 V) at time c. The ON signal φI then shifts from "L" to "H" at time d and remains at "H" at the end time e of the period T(1).

The operation of the light-emitting device 65 and the light-emitting chip C1 will be discussed below in accordance with the timing chart of FIG. 9 while referring to FIGS. 4B and 5. An explanation will be given by taking as an example the periods T(1) and T(2) in which the ON/OFF state of the VCSEL1 and VCSEL2 are controlled.

(1) Time a

[Light-Emitting Device 65]

At time a, in the light-emitting device 65, the reference potential supplier 160 of the signal generating circuit 110 sets the reference potential Vsub to be "H" (0 V). The power supply potential supplier 170 sets the power supply potential Vgk to be "L" (−5 V). Then, the power supply line 200a on the circuit substrate 62 of the light-emitting device 65 is made to have "H" (0 V), which is the level of the reference potential Vsub, and the Vsub terminals of the light-emitting chips C1 through C40 are also made to have "H" (see FIGS. 4A and 4B). Likewise, the power supply line 200b on the circuit substrate 62 is made to have "L" (−5 V), which is the level of the power supply potential Vgk, and the Vgk terminals of the light-emitting chips C1 through C40 are also made to have "L" (see FIGS. 4A and 4B). Then, the power supply line 71 of each of the light-emitting chips C1 through C40 is made to have "L" (see FIG. 5).

The transfer signal generator 120 of the signal generating circuit 110 sets each of the first and second transfer signals φ1 and φ2 to be at "H" (0 V). The first and second transfer signal lines 201 and 202 are also made to have "H" (see FIG. 4B). This causes the φ1 terminal and the φ2 terminal of each of the light-emitting chips C1 through C40 to be at "H". The potential of the first transfer signal line 72 connected to the φ1 terminal via the current limiting resistor R1 is also made to have "H", while that of the second transfer signal line 73 connected to the φ2 terminal via the current limiting resistor R2 is also made to have "H" (see FIG. 5).

The ON signal generator 140 of the signal generating circuit 110 sets the ON signals φI1 through φI40 to be at "H" (0 V). The ON signal lines 204-1 through 204-40 are also made to have "H" (see FIG. 4B). This causes the φI terminal of each of the light-emitting chips C1 through C40 to be at "H" via the current limiting resistor RI and also the ON signal line 75 connected to the φI terminal to be at "H" (0 V) (see FIG. 5).

[Light-Emitting Chip C1]

The anode (p-anode layer 85) of the setting thyristor S is connected to the cathode (n-cathode DBR layer 83) of the VCSEL via the tunnel junction layer 84. The anode (p-anode DBR layer 81) of the VCSEL is connected to the Vsub terminal set to be at "H".

The anode (p-anode layer 85) of the transfer thyristor T is connected to the cathode (n-cathode DBR layer 83) of the under diode UD via the tunnel junction layer 84. The anode (p-anode DBR layer 81) of the under diode UD is connected to the Vsub terminal set to be at "H".

The cathodes of the odd-numbered transfer thyristors T1, T3, T5, . . . are connected to the first transfer signal line 72 and are set to be at "H" (0 V). The cathodes of the even-numbered transfer thyristors T2, T4, T6, . . . are connected to the second transfer signal line 73 and are set to be at "H" (0 V). The transfer thyristor T is OFF with both the anode and the cathode set at "H". The under diode UD is OFF with both the anode and the cathode set at "H".

The cathode terminal of the setting thyristor S is connected to the ON signal line 75 which is at "H" (0 V). The setting thyristor S is OFF with both the anode and the cathode set at "H". The VCSEL is OFF with both the anode and the cathode set at "H".

As stated above, the gate Gt1 of the transfer thyristor T1 is connected to the cathode terminal of the start diode SD. The gate Gt1 is connected to the power supply line 71, which is set at the power supply potential Vgk ("L" (−5 V)), via the power supply line resistor Rg1. The anode terminal of the start diode SD is connected to the second transfer signal line 73 and is connected to the φ2 terminal, which is set at "H" (0 V), via the current limiting resistor R2. The start diode SD is thus forward biased. The potential of the cathode (gate Gt1) of the start diode SD is equal to the value (−1.5 V) obtained by subtracting the forward potential Vd (1.5 V) of the pn junction from the potential of the anode ("H" (0 V)) of the start diode SD. When the gate Gt1 is at −1.5 V, the anode (gate Gt1) of the coupling diode D1 is also at −1.5 V and the cathode is connected to the power supply line 71 ("L" (−5 V)) via the power supply line resistor Rg2. The coupling diode D1 is thus forward biased. The potential of the gate Gt2 is equal to the value (−3 V) obtained by subtracting the forward potential Vd (1.5 V) of the pn junction from the potential (−1.5 V) of the gate Gt1. The coupling diode D2 is forward biased since the anode (gate Gt2) is −3 V and the cathode is connected to the power supply line 71 ("L" (−5 V)) via the power supply line resistor Rg3. The potential of the gate Gt3 is thus −4.5 V obtained by subtracting the forward potential Vd (1.5 V) of the pn junction from the potential (−3 V) of the gate Gt2. However, the gates Gt4 through Gt128 are not influenced by the anode ("H" (0 V)) of the start diode SD, and the potential of the gates Gt4 through Gt128 is at "L" (−5 V), which is the potential of the power supply line 71.

Since the gate Gt is equal to the gate Gs, the potential of the gate Gs is the same as the gate Gt. The threshold voltage of the setting thyristor T and the setting thyristor S is the value obtained by subtracting the forward potential Vd (1.5 V) of the pn junction from the potential of the gate Gt (gate Gs). That is, the threshold voltage of the transfer thyristor T1 and the setting thyristor S1 is −3 V, that of the transfer thyristor T2 and the setting thyristor S2 is −4.5 V, that of the transfer thyristor T3 and the setting thyristor S3 is −6 V, and that of the transfer thyristors T4 through T128 and the setting thyristors S4 through S128 is −6.5 V.

(2) Time b

At time b in the timing chart of FIG. 9, the first transfer signal φ1 shifts from "H" (0 V) to "L" (−5 V). This causes the light-emitting device 65 to start operating.

When the first transfer signal φ1 has shifted from "H" to "L", the potential of the first transfer signal line 72 changes from "H" (0 V) to "L" (−5 V) via the φ1 terminal and the current limiting resistor R1. Since the voltage applied to the transfer thyristor T1 is −3.3 V, the transfer thyristor T1 having a threshold of −3 V is turned ON. At this time, a current flows through the under diode UD1 so that the under diode UD1 shifts from the OFF state to the ON state. As a result of the transfer thyristor T1 being turned ON, the potential of the first transfer signal line 72 becomes close to −3.2 V (negative potential having an absolute value greater than 3.2) obtained by subtracting the forward potential Vd (1.5 V) of the pn junction from the potential of the anode of the transfer thyristor T1 (−1.7 V, which is the potential applied to the under diode UD1).

The threshold voltage of the transfer thyristor T3 is −6 V, while that of the fifth and greater odd-numbered transfer thyristors T is −6.5 V. The voltage applied to the fifth and greater odd-numbered transfer thyristors T results in −1.5 V obtained by adding a voltage of 1.7 V applied to the VCSEL to −3.2 V. Hence, the fifth and greater odd-numbered transfer thyristors T are not turned ON.

The even-numbered transfer thyristors T are not turned ON because the second transfer signal φ2 is at "H" (0 V) and the second transfer signal line 73 is accordingly at "H" (0 V).

When the transfer thyristor T1 is turned ON, the potential of the gate Gt1/Gs1 is made to have "H" (0 V), which is the potential of the anode of the transfer thyristor T1. The potential of the gate Gt2 (gate Gs2) is −1.5 V, that of the gate Gt3 (gate Gs3) is −3 V, that of the gate Gt4 (gate Gs4) is −4.5 V, and the gate Gt5 (gate Gs5) through the gate Gt128 (gate Gs128) is at "L".

The threshold voltage of the setting thyristor S1 is −1.5 V, that of the transfer thyristor T2 and the setting thyristor S2 is −3 V, that of the transfer thyristor T3 and the setting thyristor S3 is −4.5 V, that of the transfer thyristor T4 and the setting thyristor S4 is −6 V, and that of the transfer thyristors T5 through T128 and the setting thyristors S5 through S128 is −6.5 V.

However, since the first transfer signal line 72 is at −1.5 V because of the ON-state transfer thyristor T1, the odd-numbered transfer thyristors T in the OFF state are not turned ON. The second transfer signal line 73 is at "H" (0 V), and the even-numbered transfer thyristors T are not turned ON. Since the ON signal line 75 is at "H" (0 V), none of the VCSELs are turned ON.

Immediately after time b, the transfer thyristors T1 and the under diode UD1 are ON, while the other transfer thyristors T, other under diodes UD, setting thyristors S, and VCSELs are OFF. "Immediately after time b, c, . . . " refers to a time when the light-emitting chip C has become a steady state after the states of elements such as thyristors have shifted due to a change in the potential of a corresponding signal line at time b, c, . . . .

(3) Time c

At time c, the ON signal φI1 shifts from "H" (0 V) to "L" (−5 V).

When the ON signal φI1 has shifted from "H" to "L", the potential of the ON signal line 75 changes from "H" (0 V) to "L" (−5 V) via the current limiting resistor RI and the φI terminal. Then, a voltage of −3.3 V obtained by adding a voltage of 1.7 V applied to the VCSEL to −5 V is applied to the setting thyristor S1. This turns ON the setting thyristor S1 having a threshold of −1.5 V and accordingly causes the VCSEL1 to emit light (ON). As a result of the VCSEL1 emitting light, the potential of the ON signal line 75 becomes close to −3.2 V. Although the threshold voltage of the setting thyristor S2 is −3 V, the voltage applied to the setting thyristor S2 results in −1.5 V obtained by adding the voltage of 1.7 V applied to the VCSEL to −3.2 V. Hence, the setting thyristor S2 is not turned ON.

Immediately after time c, the transfer thyristor T1, under diode UD1, and setting thyristor S1 are in the ON state, and the VCSEL1 emits light (ON).

(4) Time d

At time d, the ON signal φI1 shifts from "L" (−5 V) to "H" (0 V).

When the ON signal φI1 has shifted from "L" to "H", the potential of the ON signal line 75 changes from −3.2 V to "H" via the current limiting resistor RI and the φI terminal. Then, the cathode of the setting thyristor S1 and the anode of the VCSEL1 are both made to have "H". As a result, the setting thyristor S1 is turned OFF, and the VCSEL1 stops emitting light (OFF). The period for which the VCSEL1 emits light is the period for which the VCSEL1 remains at "L", that is, the period from time c when the ON signal φI1 is shifted from "H" to "L" until time d when the ON signal φI1 is shifted from "L" to "H".

Immediately after time d, the transfer thyristor T1 is in the ON state.

(5) Time e

At time e, the second transfer signal φ2 shifts from "H" (0 V) to "L" (−5 V). At this time, the period T(1) for which the ON/OFF state of the VCSEL1 is controlled is over, and the period T(2) for which the ON/OFF state of the VCSEL2 is controlled starts.

When the second transfer signal φ2 has shifted from "H" to "L", the potential of the second transfer signal line 73 changes from "H" to "L" via the φ2 terminal. As stated above, since the transfer thyristor T2 has a threshold of −3 V, it is turned ON. At the same time, a current flows through the under diode UD2 so that the under diode UD2 shifts from the OFF state to the ON state.

As a result of the transfer thyristor T2 and the under diode UD2 being turned ON, the potential of the gate Gt2/Gs2 is made to have "H" (0 V), that of the gate Gt3 (gate Gs3) is −1.5 V, that of the gate Gt4 (gate Gs4) is −3 V, that of the gate Gt5 (gate Gs5) is −4.5 V, and the gate Gt6 (gate Gs6) through the gate Gt128 (gate Gs128) is −5 V.

Immediately after time e, the transfer thyristors T1 and T2 and under diodes UD1 and UD2 are in the ON state.

(6) Time f

At time f, the first transfer signal φ1 shifts from "L" (−5 V) to "H" (0 V).

When the first transfer signal φ1 has shifted from "L" to "H", the potential of the first transfer signal line 72 changes from "L" to "H" via the φ1 terminal. Then, the anode and the cathode of the ON-state transfer thyristor T1 are both made to have "H" so that the transfer thyristor T1 is turned OFF. At this time, the anode and the cathode of the under diode UD1 are also both made to have "H" so that the under diode UD1 is changed from the ON state to the OFF state.

Then, the potential of the gate Gt1 (gate Gs1) approaches the power supply potential Vgk ("L" (−5 V)) of the power supply line 71 via the power supply line resistor Rg1. As a result, the coupling diode D1 enters a reverse bias state in which a potential is applied in the direction in which a current does not flow. Hence, the gate Gt1 (gate Gs1) is no longer influenced by the state ("H" (0 V)) of the gate Gt2 (gate Gs2). That is, the threshold voltage of the transfer thyristor T having the gate Gt connected to the reverse-biased coupling diode D is −6.5 V, and even when the first transfer signal φ1 or the second transfer signal φ2 is made to have "L" (−5 V), this transfer thyristor T is not turned ON.

Immediately after time f, the transfer thyristor T2 and the under diode UD2 are in the ON state.

(7) Other Times

At time g, when the ON signal φI1 is shifted from "H" (0 V) to "L" (−5 V), the setting thyristor S2 is turned ON and the VCSEL2 starts to emit light (is turned ON), as in the setting thyristor S1 and the VCSEL1 at time c.

Then, at time h, when the ON signal φI1 is shifted from "L" (−5 V) to "H" (0 V), the setting thyristor S2 is turned OFF and the VCSEL2 stops emitting light (is turned OFF), as in the setting thyristor S1 and the VCSEL 1 at time d.

Then, at time i, when the first transfer signal φ1 is shifted from "H" (0 V) to "L" (−5 V), the transfer thyristor T3 having a threshold voltage of −3 V is turned ON, as in the transfer thyristor T1 at time b and the transfer thyristor T2 at time e. At time i, the period T(2) for which the ON/OFF state of the VCSEL2 is controlled is over, and the period T(3) for which the ON/OFF state of the VCSEL3 is controlled starts.

Thereafter, the ON/OFF state of the VCSEL is controlled in a similar manner.

To stop the VCSEL from emitting light (to keep the VCSEL at OFF), the ON signal φI is maintained at "H" (0 V), as in the ON signal φI1 in the period T(4) from time j to time k for which the ON/OFF state of the VCSEL4 is controlled, as shown in FIG. 9. Then, even when the threshold voltage of the setting thyristor S4 is −1.5 V, the setting thyristor S4 is not turned ON, and the VCSEL4 remains OFF.

As described above, the gate terminals Gt of the transfer thyristors T are connected with each other via the corresponding coupling diodes D. When the potential of a gate Gt is changed, the potential of another gate Gt connected to this gate Gt via a forward-biased coupling diode D is also changed. This changes the threshold voltage of the transfer thyristor T having this gate Gt. If the threshold voltage of the transfer thyristor T is higher than −3.3 V (negative potential having an absolute value smaller than 3.3), the transfer thyristor T is turned ON at a timing when the first transfer signal φ1 or the second transfer signal φ2 shifts from "H" (0 V) to "L" (−5 V).

The setting thyristor S having the gate Gs connected to the gate Gt of the ON-state transfer thyristor T is turned ON when the ON signal φI is shifted from "H" (0 V) to "L" (−5 V) since the threshold of the setting thyristor S is −1.5 V. Then, the VCSEL connected in series with this setting thyristor S is turned ON (starts emitting light).

That is, when the transfer thyristor T is turned ON, the VCSEL to be subjected to ON/OFF control (subject VCSEL) is determined, and the ON signal φI at "L" (−5 V) turns ON the setting thyristor S connected in series with the subject VCSEL and also causes the VCSEL to emit light (to be turned ON).

The ON signal φI at "H" (0 V) maintains the setting thyristor S at OFF and also keeps the associated VCSEL in the OFF state. That is, the ON signal φI sets the state of the VCSEL to be ON or OFF.

In this manner, the ON signal φI is set in accordance with image data, and the ON/OFF state of each VCSEL is controlled.

The setting thyristor S may drive the VCSEL so as to increase the amount of light of the VCSEL in the ON state.

As described above, the light-emitting chips C are formed as a self-scanning light-emitting array (self-scanning light-emitting devices (SLEDs)).

(Light-Emitting Chip C' as Comparative Example)

A light-emitting chip C' will be described below for comparison with the light-emitting chip C.

Figure 10B:
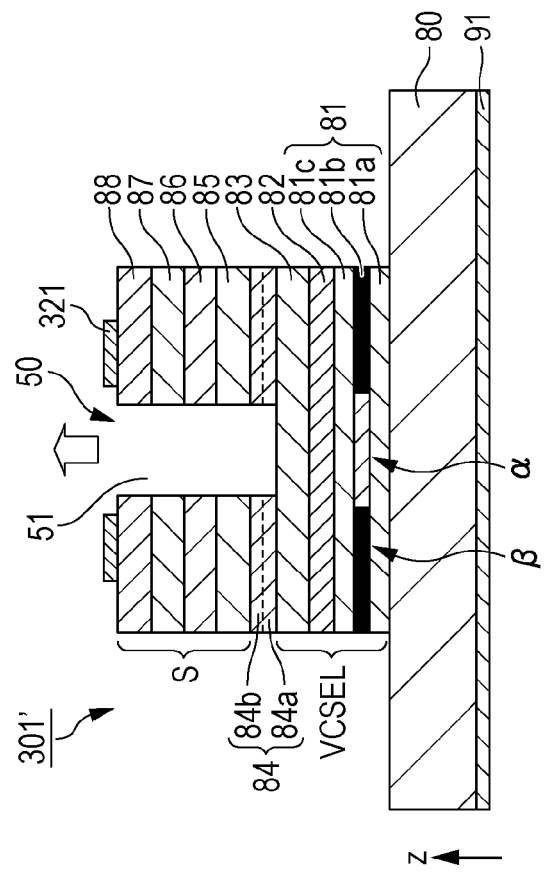
FIG. 10B is a sectional view taken along line XB-XB in FIG. 10A.
Figure 10A:
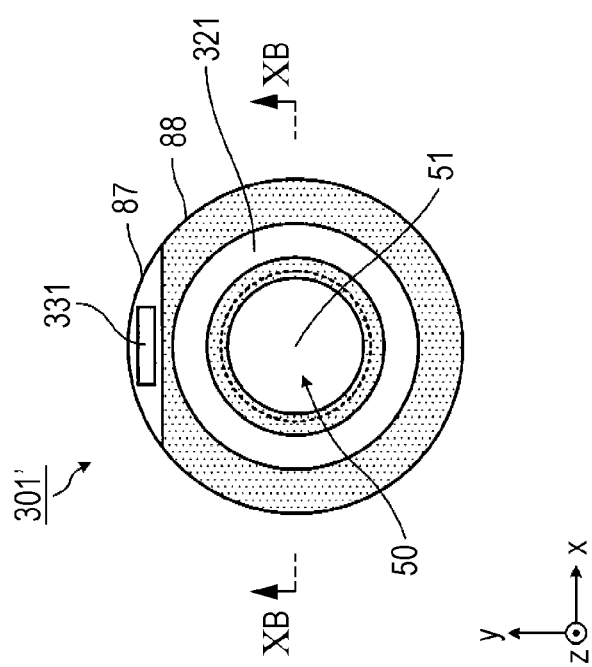
FIG. 10A is an enlarged plan view of a multilayer structure constituted by a VCSEL and a setting thyristor stacked on each other in a light-emitting chip which does not utilize the exemplary embodiment.

The light-emitting chip C' is similar to the light-emitting chip C of the exemplary embodiment, except that a multilayer structure 301', which is different from the multilayer structure 301, is utilized. The light-emitting chip C' will be described by referring to the multilayer structure 301', and the other portions similar to those of the exemplary embodiment will not be explained. In FIGS. 10A and 10B, portions of the light-emitting chip C' having the same functions as those of the light-emitting chip C are designated by like reference numerals.

FIGS. 10A and 10B are enlarged views illustrating the multilayer structure 301' constituted by a VCSEL and a setting thyristor S stacked on each other in the light-emitting chip C'. FIG. 10A is a plan view of the multilayer structure 301'. FIG. 10B is a sectional view taken along line XB-XB in FIG. 10A.

As shown in FIGS. 10A and 10B, the multilayer structure 301' of the light-emitting chip C' is formed in a cylindrical shape as a result of removing the semiconductor multilayer body (n-cathode layer 88, p-gate layer 87, n-gate layer 86, p-anode layer 85, tunnel junction layer 84, n-cathode DBR layer 83, light-emitting layer 82, and p-anode DBR layer 81) until the substrate 80 by etching. The holes 55 formed in the multilayer structure 301 of the light-emitting chip C are not provided in the multilayer structure 301'. Without the holes 55, the current confinement layer 81b forming the p-anode DBR layer 81 is oxidized only from the side surfaces of the current confinement layer 81b exposed on the outer edges of the multilayer structure 301'. The portion which is not oxidized (current passing portion α) is formed in a circular shape.

Oxidation of the current confinement layer 81b of the p-anode DBR layer 81 starts and proceeds from the outer edges of the multilayer structure 301'. Hence, the distance from the outer edges of the multilayer structure 301' to the leading ends of the current blocking portion β is determined by the oxidation time. If the oxidation time and the area of the current passing portion α are set to be the same as those of the light-emitting chip C of the exemplary embodiment, the area of the planar shape of the portion which functions as the setting thyristor S (n-cathode layer 88, p-gate layer 87, n-gate layer 86, and p-anode layer 85) and that of the tunnel junction layer 84 shown in FIGS. 10A and 10B become smaller than those of the multilayer structure 301 of the light-emitting chip C shown in FIGS. 7A and 7B. Likewise, the area of the portion which functions as the current path from the setting thyristor S to the VCSEL (n-cathode DBR layer 83, light-emitting layer 82, and upper p-anode DBR layer 81c above the current confinement layer 81b) also becomes smaller than that of the multilayer structure 301 of the light-emitting chip C shown in FIGS. 7A and 7B. In particular, the resistance of the tunnel junction layer 84 is high, and if the area of the tunnel junction layer 84 is smaller, the resistance of the path through which a current flows from the setting thyristor S to the VCSEL via the tunnel junction layer 84 becomes higher, which decreases the operation speed.

Additionally, as shown in FIG. 10A, in the multilayer structure 301', the area of the portion of the exposed p-gate layer 87 on which the p-ohmic electrode 331 of the setting thyristor S is disposed also becomes narrow. To reduce the resistance of the path through which a current flows from the setting thyristor S to the VCSEL via the tunnel junction layer 84 and also to secure a sufficiently large area of the portion of the exposed p-gate layer 87 on which the p-ohmic electrode 331 of the setting thyristor S is disposed, a longer oxidation time is required.

As described above, in the light-emitting chip C of the exemplary embodiment, the current blocking portion β is formed as a result of the current confinement layer 81b being oxidized from the outer edges of the multilayer structure 301 and via the holes 55. With this configuration, the area of the planar shape of the setting thyristor S does not become small. Hence, even with a high resistance of the tunnel junction layer 84, the resistance of the path through which a current flows from the setting thyristor S to the VCSEL via the tunnel junction layer 84 does not become high. Additionally, the current confinement layer 81b is oxidized from the outer edges of the multilayer structure 301 and also via the holes 55, and thus, a longer oxidation time is not required. It is also possible to secure a sufficiently large area of the portion of the exposed p-gate layer 87 on which the p-ohmic electrode 331 of the setting thyristor S is disposed.

In the above-described exemplary embodiment, the current confinement layer 81b is provided in the p-anode DBR layer 81. The holes 55 are thus formed so that the side surfaces of the current confinement layer 81b in the p-anode DBR layer 81 are exposed. Alternatively, a current confinement layer may be provided in the n-cathode DBR layer 83. In this case, the holes 55 are formed so that the side surfaces of the current confinement layer in the n-cathode DBR layer 83 are exposed.

The light-emitting chip C of the exemplary embodiment includes the under diodes UD. However, the provision of the under didoes UD may be omitted. That is, in the multilayer structure 302 where the under diode UD is formed, the p-anode DBR layer 81, light-emitting layer 82, n-cathode DBR layer 83, and tunnel junction layer 84 are removed by etching, and then, the p-anode layer 85, n-gate layer 86, p-gate layer 87, and n-cathode layer 88 are deposited on the remaining portion of the multilayer structure 302.

In the light-emitting chip C of the exemplary embodiment, a multilayer structure is formed by disposing a VCSEL (light-emitting element) on the substrate 80 and then by stacking a setting thyristor S on the VCSEL. Conversely, a multilayer structure may be formed by disposing a thyristor on the substrate and then by disposing a light-emitting element on the thyristor.

In the exemplary embodiment, as the light-emitting elements, VCSELs are used. Alternatively, another type of light-emitting elements, such as light-emitting diodes (LEDs), may be utilized.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light-emitting component comprising:
   a substrate;
   a plurality of light-emitting elements that are disposed on the substrate and that emit light in a direction intersecting with a surface of the substrate; and
   a plurality of thyristors that are stacked on the plurality of light-emitting elements and that are turned ON to drive the corresponding light-emitting elements so that the light-emitting elements emit light or an amount of light emitted from the light-emitting elements is increased,
   wherein each of the plurality of light-emitting elements includes a current confinement region which is oxidized via a plurality of holes provided in a multilayer structure, the multilayer structure being constituted by a corresponding light-emitting element and a corresponding thyristor,
   the plurality of thyristors is stacked on the plurality of light-emitting elements via a tunnel junction layer,
   the plurality of holes does not reduce the area of the tunnel junction layer in a plan view compared to a case that the corresponding light-emitting element and the corresponding thyristor are formed in a cylindrical shape.

2. The light-emitting component according to claim 1, wherein, in the multilayer structure, the plurality of the holes are arranged circularly around a light-emitting window from which light is emitted from the corresponding light-emitting element.

3. The light-emitting component according to claim 1, wherein each of the plurality of thyristors has a cavity in a path through which light emitted from a corresponding light-emitting element travels toward a corresponding thyristor.

4. The light-emitting component according to claim 2, wherein each of the plurality of thyristors has a cavity in a path through which light emitted from a corresponding light-emitting element travels toward a corresponding thyristor.

5. The light-emitting component according to claim 1, further comprising:
   a plurality of transfer elements that are connected to the plurality of thyristors and are sequentially turned ON so as to turn ON the corresponding thyristors.

6. The light-emitting component according to claim 2, further comprising:
   a plurality of transfer elements that are connected to the plurality of thyristors and are sequentially turned ON so as to turn ON the corresponding thyristors.

7. The light-emitting component according to claim 3, further comprising:
   a plurality of transfer elements that are connected to the plurality of thyristors and are sequentially turned ON so as to turn ON the corresponding thyristors.

8. The light-emitting component according to claim 4, further comprising:
   a plurality of transfer elements that are connected to the plurality of thyristors and are sequentially turned ON so as to turn ON the corresponding thyristors.

9. The light-emitting component according to claim 1, wherein the plurality of light-emitting elements are vertical cavity surface emitting lasers.

10. The light-emitting component according to claim 6, wherein the plurality of light-emitting elements are vertical cavity surface emitting lasers.

11. The light-emitting component according to claim 3, wherein the plurality of light-emitting elements are vertical cavity surface emitting lasers.

12. A light-emitting component comprising:
a substrate;
a plurality of light-emitting elements that are disposed on the substrate and that emit light in a direction intersecting with a surface of the substrate; and
a plurality of thyristors that are stacked between the substrate and the plurality of light-emitting elements and that are turned ON to drive the corresponding light-emitting elements so that the light-emitting elements emit light or an amount of light emitted from the light-emitting elements is increased,
wherein each of the plurality of light-emitting elements includes a current confinement region which is oxidized via a plurality of holes provided in a multilayer structure, the multilayer structure being constituted by a corresponding light-emitting element and a corresponding thyristor,
the plurality of thyristors is stacked on the plurality of light-emitting elements via a tunnel junction layer,
the plurality of holes does not reduce the area of the tunnel junction layer in a plan view compared to a case that the corresponding light-emitting element and the corresponding thyristor are formed in a cylindrical shape.

* * * * *